US011400564B1

(12) United States Patent
Chapman et al.

(10) Patent No.: US 11,400,564 B1
(45) Date of Patent: Aug. 2, 2022

(54) METHODS OF FORMING A LIQUID METAL EMBRITTLEMENT RESISTANT SUPERABRASIVE COMPACT, AND SUPERABRASIVE COMPACTS AND APPARATUSES USING THE SAME

(71) Applicant: US SYNTHETIC CORPORATION, Orem, UT (US)

(72) Inventors: Mark P. Chapman, Provo, UT (US); Jason Dean Blackburn, Orem, UT (US)

(73) Assignee: US SYNTHETIC CORPORATION, Orem, UT (US)

( * ) Notice: Subject to any disclaimer, the term of this patent is extended or adjusted under 35 U.S.C. 154(b) by 318 days.

(21) Appl. No.: 16/685,435

(22) Filed: Nov. 15, 2019

Related U.S. Application Data

(63) Continuation of application No. 16/430,891, filed on Jun. 4, 2019, now abandoned, which is a continuation of application No. 15/131,687, filed on Apr. 18, 2016, now Pat. No. 10,350,734.

(60) Provisional application No. 62/150,621, filed on Apr. 21, 2015.

(51) Int. Cl.
| | |
|---|---|
| *C23C 14/18* | (2006.01) |
| *C23C 16/06* | (2006.01) |
| *E21B 10/567* | (2006.01) |
| *E21B 10/46* | (2006.01) |
| *B24D 18/00* | (2006.01) |

(52) U.S. Cl.
CPC .......... *B24D 18/0018* (2013.01); *C23C 14/18* (2013.01); *C23C 16/06* (2013.01); *E21B 10/567* (2013.01); *B24D 18/0009* (2013.01); *E21B 10/46* (2013.01)

(58) Field of Classification Search
CPC ........ E21B 10/46; E21B 10/56; E21B 10/567; C22C 29/00; C22C 29/02; C22C 29/06; C22C 29/12; C22C 32/00; C22C 32/0005; C22C 32/0047
See application file for complete search history.

(56) References Cited

U.S. PATENT DOCUMENTS

| | | | |
|---|---|---|---|
| 4,241,135 A | 12/1980 | Lee et al. | |
| 4,268,276 A | 5/1981 | Bovenkerk | |
| 4,410,054 A | 10/1983 | Nagel et al. | |
| 4,452,539 A | 6/1984 | Evans et al. | |
| 4,468,138 A | 8/1984 | Nagel | |
| 4,560,014 A | 12/1985 | Geczy | |

(Continued)

FOREIGN PATENT DOCUMENTS

| | | |
|---|---|---|
| CN | 102066787 A | 5/2011 |
| DE | 102013213853 A1 | 1/2015 |

(Continued)

OTHER PUBLICATIONS

U.S. Appl. No. 62/730,137, filed Sep. 12, 2018.

(Continued)

*Primary Examiner* — Pegah Parvini
(74) *Attorney, Agent, or Firm* — Dorsey & Whitney LLP

(57) ABSTRACT

Embodiments of the invention relate to liquid metal embrittlement ("LME")-resistant superabrasive compacts, methods of making the same, and drill bits incorporating the same. The LME-resistant superabrasive compacts include a braze-resistant region on one or more portions of a substrate expected to be under residual tensile stress and susceptible to LME during brazing.

17 Claims, 12 Drawing Sheets

(56) References Cited

U.S. PATENT DOCUMENTS

| | | |
|---|---|---|
| 4,738,322 A | 4/1988 | Hall et al. |
| 4,811,801 A | 3/1989 | Salesky et al. |
| 4,913,247 A | 4/1990 | Jones |
| 5,016,718 A | 5/1991 | Tandberg |
| 5,092,687 A | 3/1992 | Hall |
| 5,120,327 A | 6/1992 | Dennis |
| 5,135,061 A | 8/1992 | Newton, Jr. |
| 5,154,245 A | 10/1992 | Waldenstrom et al. |
| 5,180,022 A | 1/1993 | Brady |
| 5,364,192 A | 11/1994 | Damm et al. |
| 5,368,398 A | 11/1994 | Damm et al. |
| 5,460,233 A | 10/1995 | Meany et al. |
| 5,480,233 A | 1/1996 | Cunningham |
| 5,510,193 A | 4/1996 | Cerutti et al. |
| 5,544,713 A | 8/1996 | Dennis |
| 5,833,021 A | 11/1998 | Mensa-Wilmot et al. |
| 5,875,862 A | 3/1999 | Jurewicz et al. |
| 6,793,681 B1 | 9/2004 | Pope et al. |
| 6,872,356 B2 | 3/2005 | Butcher et al. |
| 7,368,079 B2 | 5/2008 | Yao et al. |
| 7,678,325 B2 | 3/2010 | Gardinier |
| 7,703,982 B2 | 4/2010 | Cooley |
| 7,726,421 B2 | 6/2010 | Middlemiss |
| 7,866,418 B2 | 1/2011 | Bertagnolli et al. |
| 8,202,335 B2 | 6/2012 | Cooley et al. |
| 8,297,382 B2 | 10/2012 | Bertagnolli et al. |
| 8,309,050 B2 | 11/2012 | Keshavan et al. |
| 8,616,306 B2 | 12/2013 | Bertagnolli et al. |
| 8,662,210 B2 | 3/2014 | Mukhopadhyay et al. |
| 8,678,657 B1 | 3/2014 | Knuteson et al. |
| 8,727,044 B2 | 5/2014 | Qian et al. |
| 8,753,562 B2 | 6/2014 | Wardoyo et al. |
| 8,757,299 B2 | 6/2014 | Digiovanni et al. |
| 8,863,864 B1 | 10/2014 | Miess |
| 8,961,030 B2 | 2/2015 | Kirchhoff et al. |
| 9,080,385 B2 | 7/2015 | Sexton et al. |
| 9,144,886 B1 | 9/2015 | Gleason et al. |
| 9,175,726 B2 | 11/2015 | Beresch et al. |
| 9,227,302 B1 | 1/2016 | Gleason |
| 9,539,703 B2 | 1/2017 | Bao |
| 9,550,276 B1 | 1/2017 | Gleason et al. |
| 9,702,198 B1 | 7/2017 | Topham |
| 9,732,563 B1 | 8/2017 | Mukhopadhyay |
| 9,844,854 B1 | 12/2017 | Gleason et al. |
| 10,315,175 B2 | 6/2019 | Bao et al. |
| 10,920,822 B2 | 2/2021 | Gonzalez |
| 2004/0140132 A1 | 7/2004 | Middlemiss |
| 2010/0170671 A1 | 7/2010 | Sihler |
| 2011/0023375 A1 | 2/2011 | Sani et al. |
| 2011/0067929 A1 | 3/2011 | Mukhopadhyay et al. |
| 2011/0192093 A1 | 8/2011 | Wardoyo et al. |
| 2011/0259648 A1 | 10/2011 | Sani |
| 2012/0261197 A1 | 10/2012 | Miess et al. |
| 2013/0043078 A1 | 2/2013 | Qian et al. |
| 2014/0373458 A1 | 12/2014 | Miess |
| 2016/0016290 A1 | 1/2016 | Miess et al. |
| 2016/0047430 A1 | 2/2016 | Glidewell |
| 2016/0333932 A1 | 11/2016 | Iwata et al. |

FOREIGN PATENT DOCUMENTS

| | | |
|---|---|---|
| JP | 2006143815 A | 6/2006 |
| WO | 2008081650 A1 | 7/2008 |
| WO | 2014011855 A1 | 1/2014 |
| WO | 2015055187 A1 | 4/2015 |
| WO | 2017034788 A1 | 3/2017 |

OTHER PUBLICATIONS

Non-Final Office Action for U.S. Appl. No. 16/489,438 dated Jun. 25, 2020.
Notice of Allowance for U.S. Appl. No. 16/489,438 dated Oct. 13, 2020.
U.S. Appl. No. 16/489,438, filed Aug. 28, 2019.
International Search Report and Written Opinion from International Application No. PCT/US2019/013604 dated Jul. 15, 2019.
Issue Notification for U.S. Appl. No. 15/131,687 dated Jun. 26, 2019.
Non-Final Office Action for U.S. Appl. No. 15/131,687 dated Sep. 20, 2018.
Non-Final Office Action for U.S. Appl. No. 16/430,891 dated Jul. 16, 2019.
Notice of Allowance for U.S. Appl. No. 15/131,687 dated Mar. 8, 2019.
U.S. Appl. No. 15/131,687, filed Apr. 18, 2016.
U.S. Appl. No. 16/430,891, filed Jun. 4, 2019.
U.S. Appl. No. 62/150,621, filed Apr. 21, 2015.
U.S. Appl. No. 62/620,840, filed Jan. 23, 2018.
U.S. Appl. No. 62/687,080, filed Jun. 19, 2018.
U.S. Appl. No. 62/804,801, filed Feb. 13, 2019.
Issue Notification for U.S. Appl. No. 16/489,438 dated Jan. 27, 2021.
Non-Final Office Action for U.S. Appl. No. 17/148,145 dated Dec. 21, 2021.

METHODS OF FORMING A LIQUID METAL EMBRITTLEMENT RESISTANT SUPERABRASIVE COMPACT, AND SUPERABRASIVE COMPACTS AND APPARATUSES USING THE SAME

CROSS-REFERENCE TO RELATED APPLICATIONS

This application is a continuation of U.S. application Ser. No. 16/430,891 filed on 4 Jun. 2019, which is a continuation of U.S. application Ser. No. 15/131,687 filed on 18 Apr. 2016, which claims priority to U.S. Provisional Patent Application No. 62/150,621 filed on 21 Apr. 2015, the disclosure of each of which is incorporated herein, in its entirety, by this reference.

BACKGROUND

Wear-resistant, superabrasive compacts are utilized in a variety of mechanical applications. For example, polycrystalline diamond compacts ("PDCs") are used in drilling tools (e.g., cutting elements, gage trimmers, etc.), machining equipment, bearing apparatuses, wire-drawing machinery, and in other mechanical apparatuses.

PDCs have found particular utility as superabrasive cutting elements in rotary drill bits, such as roller cone drill bits and fixed cutter drill bits. A PDC cutting element typically includes a superabrasive diamond layer commonly referred to as a diamond table. The diamond table is formed and bonded to a substrate using a high-pressure/high-temperature ("HPHT") process.

A fixed-cutter rotary drill bit typically includes a number of PDC cutting elements affixed to the bit body. PDC cutting elements are typically brazed directly into a preformed recess formed in a bit body of a fixed-cutter rotary drill bit. In some applications, the substrate of the PDC cutting element may be brazed or otherwise joined to an attachment member (e.g., a cylindrical backing), which may be secured to a bit body by press-fitting or brazing. Brazing may cause liquid-metal-embrittlement ("LME") in one or more portions of the substrate, which may lead to cracking, spalling, or premature failure of the superabrasive compact.

Manufacturers and users of superabrasive elements, such as PDCs, continue to seek improved processing techniques.

SUMMARY

Embodiments of the invention relate to LME-resistant superabrasive compacts, methods of making the same, and drill bits incorporating the same. In an embodiment, a method of making a liquid metal embrittlement resistant superabrasive compact is disclosed. The method includes providing a superabrasive compact. The superabrasive compact includes a superabrasive body having an upper surface, a bonding surface, and at least one lateral surface extending between the upper surface and the bonding surface. The superabrasive compact includes a carbide substrate having a base surface, an interfacial surface bonded to the bonding surface, and a peripheral surface extending between the base surface and the interfacial surface. The method further includes forming a braze-resistant region that extends into one or more surfaces of the carbide substrate. The braze-resistant region exhibits a phobic response to a liquefied braze material. The braze-resistant region includes one or more of an oxide or refractory metal.

In an embodiment, an LME-resistant superabrasive compact is disclosed. The LME-resistant superabrasive compact includes a superabrasive body including an upper surface, a bonding surface, and a lateral surface extending between the upper surface and the bonding surface. The liquid metal embrittlement resistant superabrasive compact includes a carbide substrate including a base surface, an interfacial surface bonded to the bonding surface, and a peripheral surface extending between the base surface and the interfacial surface. At least a portion of the peripheral surface has a braze-resistant region extending inwardly therein that exhibits a phobic response to a liquefied braze material. The braze-resistant region includes one or more of an oxide or a refractory metal.

In an embodiment, a method of bonding an LME-resistant superabrasive compact to a drill bit is disclosed. The method includes providing an LME-resistant superabrasive compact. The LME-resistant superabrasive compact includes a superabrasive body including an upper surface, a bonding surface, and a lateral surface extending between the upper surface and the bonding surface. The LME-resistant superabrasive compact includes a carbide substrate including a base surface, an interfacial surface bonded to the bonding surface, and a peripheral surface extending between the base surface and the interfacial surface. At least a portion of the peripheral surface has a braze-resistant region extending inwardly therein that exhibits a phobic response to a liquefied braze material. The braze-resistant region includes one or more of an oxide or a refractory metal. The method further includes brazing the liquid metal embrittlement resistant superabrasive compact to a drill bit.

In an embodiment, a drill bit is disclosed. The drill bit includes a bit body configured to engage an earthen formation and a plurality of superabrasive cutting elements affixed to the bit body via a braze material. At least one of the plurality of superabrasive cutting elements includes a superabrasive body including an upper surface, a bonding surface, and a lateral surface extending between the upper surface and the bonding surface. The at least one of the plurality of superabrasive cutting elements includes a carbide substrate including a base surface, an interfacial surface bonded to the bonding surface, and a peripheral surface extending between the base surface and the interfacial surface. At least a portion of the peripheral surface has a braze-resistant region thereon extending inwardly therein. The braze-resistant region including one or more of an oxide or a refractory metal exhibiting substantially no wetting by the braze material.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings.

DETAILED DESCRIPTION

Embodiments disclosed herein relate to LME-resistant superabrasive compacts, methods of making the same, and drill bits incorporating the same. For example, embodiments of a superabrasive compact (e.g., a PDC) may include a superabrasive body bonded to a substrate that includes at least one braze-resistant region (e.g., at least one layer) configured and/or composed to reduce a susceptibility of the substrate to LME during brazing operations. Drill bits including at least one of such superabrasive compacts are also disclosed, as well as methods of fabricating the drill bits and superabrasive compacts. It is believed that under certain conditions, when certain metallic materials (e.g., cemented carbide materials) exhibit a region of relatively high residual tensile stresses therein and are exposed to certain liquid metals or alloys, a phenomenon known as LME may occur. It is believed that when LME occurs, plastic deformation in the metallic materials of the substrate responsive to tensile stress may be limited and, as a result, unexpected cracks may form in a region of the substrate proximate to the superabrasive body of the superabrasive compact.

The at least one braze-resistant region includes a substantially non-wettable material, such as a coating or other protective material that limits the extent to which the substrate can be wetted by an LME-causing braze alloy. In some embodiments, the at least one braze-resistant region includes a thin layer of a refractory metal material on at least the portion of the substrate adjacent to the superabrasive body (e.g., portion of the substrate having residual tensile stresses present). Including a non-wettable material on and/or in the substrate enables a drill bit to be manufactured easily and rapidly by brazing the disclosed superabrasive compacts into a cutter recess or pocket with less risk of the superabrasive compact failing or cracking prematurely due to LME in a region proximate to the interface between the substrate and the superabrasive body such as a PCD table.

While the description herein provides examples relative to a drill bit assembly, the superabrasive compact embodiments disclosed herein may be used in any number of applications. For instance, superabrasive compacts disclosed herein may be used in bearing apparatus, machining equipment, molding equipment, wire dies, bearings, artificial joints, inserts, heat sinks, and other articles and apparatuses, or in any combination of the foregoing.

Figure 1A:
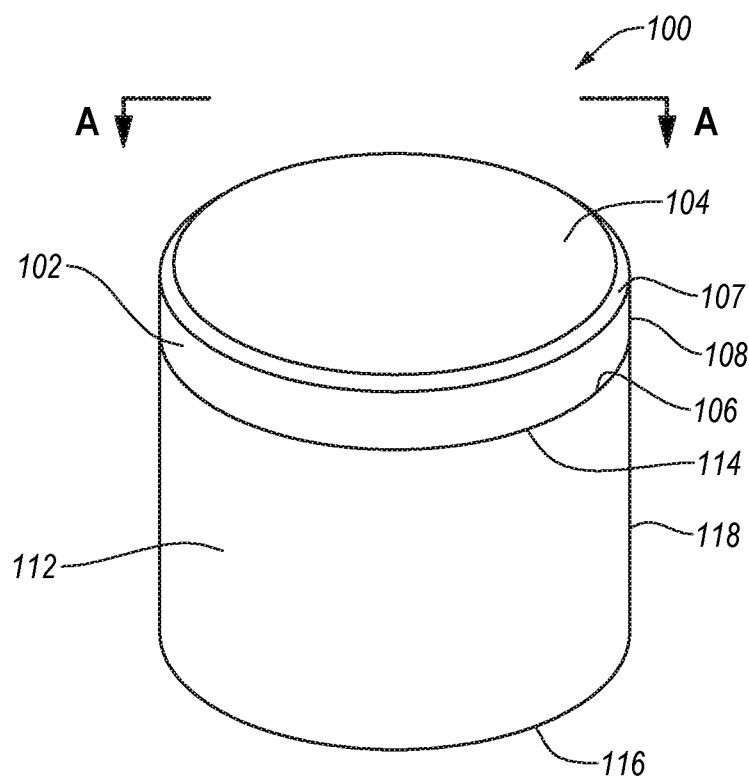
FIG. 1A is an isometric view of a superabrasive compact, prior to forming a braze-resistant region thereon, according to an embodiment.
Figure 1B:
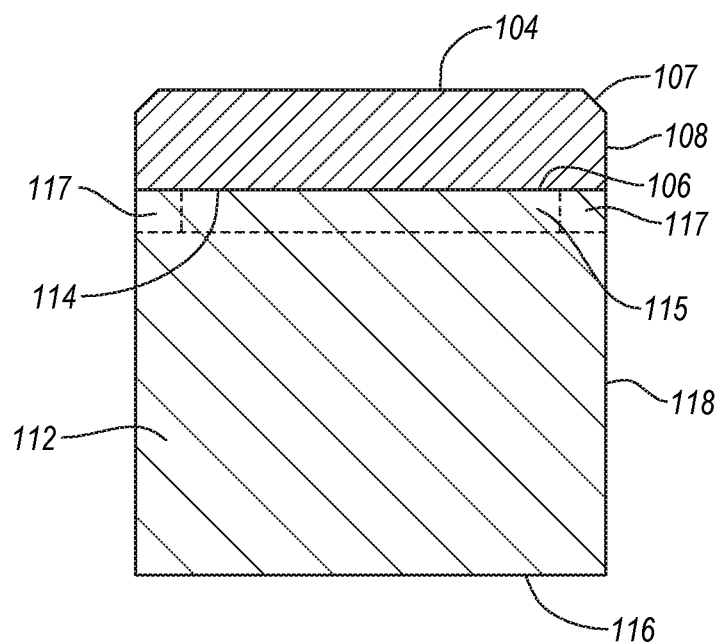
FIG. 1B is a cross-sectional view the superabrasive compact shown in FIG. 1A taken along line 1A-1A thereof.

FIGS. 1A and 1B are isometric and cross-sectional views, respectively, of a superabrasive compact 100 prior to forming a braze-resistant region thereon, according to an embodiment. The superabrasive compact 100 includes a superabrasive body 102 bonded to a substrate 112. The superabrasive body 102 may include an upper surface 104, a bonding surface 106, a lateral surface 108 extending between the upper surface 104 and the bonding surface 106, and optionally, a chamfer 107 extending between the upper surface 104 and the lateral surface 108. The substrate 112 includes an interfacial surface 114, a base surface 116 spaced from the interfacial surface 114, and at least one peripheral surface 118 extending between the interfacial surface 114 and the base surface 116. In the illustrated embodiment, the superabrasive compact 100 is cylindrical and the peripheral surface 118 is substantially continuous. However, in other embodiments, the superabrasive compact 100 may be non-cylindrical. Other shapes or configurations of a suitable superabrasive compact may include elliptical, rectangular, triangular, or other suitable configuration. Thus, in some embodiments, the peripheral surface 118 of the substrate 112 may be defined by multiple surfaces. Additionally, although the interfacial surface 114 is depicted as being substantially planar, in other embodiments, the interfacial surface 114 may exhibit a selected non-planar (e.g., domed) topography.

The substrate 112 may include, without limitation, cemented carbides, such as tungsten carbide, titanium carbide, chromium carbide, niobium carbide, tantalum carbide, vanadium carbide, or combinations thereof cemented with iron, nickel, cobalt, or alloys thereof. For example, in an embodiment, the substrate 112 comprises cobalt-cemented tungsten carbide.

As shown in FIGS. 1A and 1B, the bonding surface 106 of the superabrasive body 102 of the superabrasive compact 100 may be bonded to the interfacial surface 114 of the substrate 112. One or more of the upper surface 104, the lateral surface 108, or the chamfer 107 may function as a cutting or bearing surface.

The superabrasive body 102 may be made from a number of different superabrasive materials. Suitable materials for use in the superabrasive body 102 include natural diamond, sintered polycrystalline diamond ("PCD"), polycrystalline cubic boron nitride, diamond grains bonded together with silicon carbide, or combinations of the foregoing. In an embodiment, the superabrasive body 102 is a PCD table that includes a plurality of directly bonded-together diamond grains exhibiting diamond-to-diamond bonding therebetween (e.g., $sp^3$ bonding), which define a plurality of interstitial regions. A portion of or substantially all of the interstitial regions of such a superabrasive body 102 may include a metal-solvent catalyst or a metallic infiltrant disposed therein that is infiltrated from the substrate 112 or from another source. For example, the metal-solvent catalyst or metallic infiltrant may be selected from iron, nickel, cobalt, and alloys of the foregoing. The superabrasive body 102 may further include a thermally-stable diamond region in which the metal-solvent catalyst or metallic infiltrant has been partially or substantially completely depleted from such selected region (e.g., along one or more surfaces or volumes) of the superabrasive body 102 using, for example, an acid leaching process.

In an embodiment, the superabrasive body 102 may be integrally formed with the substrate 112. For example, the superabrasive body 102 may be a sintered PCD table that is integrally formed with the substrate 112. In such an embodiment, the infiltrated metal-solvent catalyst may be used to catalyze formation of diamond-to-diamond bonding between diamond grains of the superabrasive body 102 from diamond powder during HPHT processing. In an embodiment, the superabrasive body 102 may be a preformed superabrasive body (e.g., a preformed PCD table) that has been HPHT bonded to the substrate 112 in a second HPHT process after being initially formed in a first HPHT process. For example, the superabrasive body 102 may be a preformed PCD table that has been leached to substantially completely remove metal-solvent catalyst used in the initial manufacture thereof and subsequently HPHT bonded or brazed to the substrate 112 in a separate process.

As discussed herein, in some embodiments, the superabrasive body 102 may be leached to deplete a metal-solvent catalyst or a metallic infiltrant therefrom in order to enhance the thermal stability of the superabrasive body 102. For example, when the superabrasive body 102 is a PCD table, the superabrasive body 102 may be leached to remove at least a portion of the metal-solvent catalyst from a region thereof to a selected depth that was used to initially sinter the diamond grains to form a leached thermally-stable region. The leached thermally-stable region may extend inwardly from one or more of the upper surface 104, the lateral surface 108, and the chamfer 107 to a selected depth. Generally, the leached thermally-stable region extends from the upper surface 104 along only part of the height of the superabrasive body 102, as leaching at the interface between the substrate 112 and the superabrasive body 102 may deplete cobalt or another metal-solvent catalyst or metallic infiltrant, thereby weakening the bond between the substrate 112 and the superabrasive body 102. Thus, in a leaching process, the substrate 112 and an interior portion of the superabrasive body 102 may remain relatively unaffected. In one example, the selected depth may be about 10 µm to about 1,000 µm. More specifically, in some embodiments, the selected depth is about 50 µm to about 100 µm or about 300 µm to about 700 µm. The leaching may be performed in a suitable acid, such as aqua regia, nitric acid, hydrofluoric acid, or mixtures of the foregoing.

In some embodiments, the substrate 112 may be a cobalt-cemented tungsten carbide substrate bonded to a PCD superabrasive body 102. Such structures may be fabricated by subjecting diamond particles, placed on or proximate to a cobalt-cemented tungsten carbide substrate, to an HPHT sintering process. The diamond particles with the cobalt-cemented tungsten carbide substrate may be HPHT sintered at a temperature of at least about 1000° Celsius (e.g., about 1100° C. to about 1600° C.) and a pressure of at least about 4 GPa (e.g., about 5 GPa to about 9 GPa, or about 7 GPa or more) for a time sufficient to consolidate and form a coherent mass of bonded diamond grains. In such a process, the cobalt from the cobalt-cemented tungsten carbide substrate may sweep into interstitial regions between the diamond particles to catalyze growth of diamond between the diamond particles. More particularly, following HPHT processing the superabrasive body 102 may comprise a matrix of diamond grains that are bonded with each other via diamond-to-diamond bonding and the interstitial regions between the diamond grains may be at least partially occupied by cobalt that has been swept in, thereby creating a network of diamond grains with interposed cobalt.

In some embodiments, PCD tables and/or PDCs may be formed at ultra high-pressure and/or high-temperatures (e.g., pressures above about 7.5 GPa cell pressure and/or temperatures above about 1000° C.). The PCD table so formed may exhibit lower residual compressive stress therein and the substrate may exhibit lower residual tensile stress therein than a PDC formed at pressures below 7.5 GPa, yet still experience LME. Such PCDs and PDCS and methods for making the same are disclosed in U.S. Pat. Nos. 7,866,418 and 8,297,382, which are incorporated herein, in their entirety, by this reference. The LME resistant superabrasive compacts or methods of making the same disclosed herein may be useful in reducing or eliminating LME in PDCs formed at such ultra high-pressures and/or high-temperatures. For example, a PDC formed at a cell pressure greater than about 7.5 GPa and a temperature greater than about 1000° C. may include and/or incorporate any of the braze resistant layers disclosed herein, and may be formed using any of the methods disclosed herein.

As described herein, bonding of the substrate 112 to the superabrasive body 102 may result in formation of a region 115 of high residual tensile stresses (e.g., greater than 40,000 psi) within the substrate 112. More particularly, when the superabrasive body 102 is made of PCD and bonded to the substrate 112 formed of, for example, cobalt-cemented tungsten carbide using an HPHT process, the region 115 of residual tensile stresses may form adjacent to the interfacial surface 114 of the substrate 112. The residual compressive stresses of the superabrasive body 102 may generate tensile stress in the substrate 112 bonded thereto. Moreover, the region 115 may extend into the substrate 112 along substantially the entire interfacial surface 114 and to a particular depth profile from the interfacial surface 114.

The region 115 of residual tensile stresses may include tensile stresses that may compromise the durability of the substrate 112 and the superabrasive body 102. Moreover, if certain liquid metals (e.g., zinc-containing alloys) are applied to the peripheral surface 118 of the substrate 112 in and/or near the region 115, the combination of the brazing conditions and certain liquid metals may cause LME to occur in the region 115 adjacent to the interfacial surface 114. For instance, the liquid metal may wet the substrate 112 at the region 115 of residual tensile stress and the brazing conditions may cause cracking in the region 115 of the substrate 112, which is believed to be a manifestation of LME. However, it is also observed that cracking in the region 115 may also occur without exposure to a brazing material, but at lower rates. The substrate 112 may be particularly susceptible to LME in a cracking zone 117 at or near the peripheral surface 118 directly adjacent to the superabrasive body 102, which may cause cracking, spalling, or failure of the superabrasive body 102 adjacent thereto. The cracking zone 117 may include the peripheral portions of the region 115.

Figure 2A:
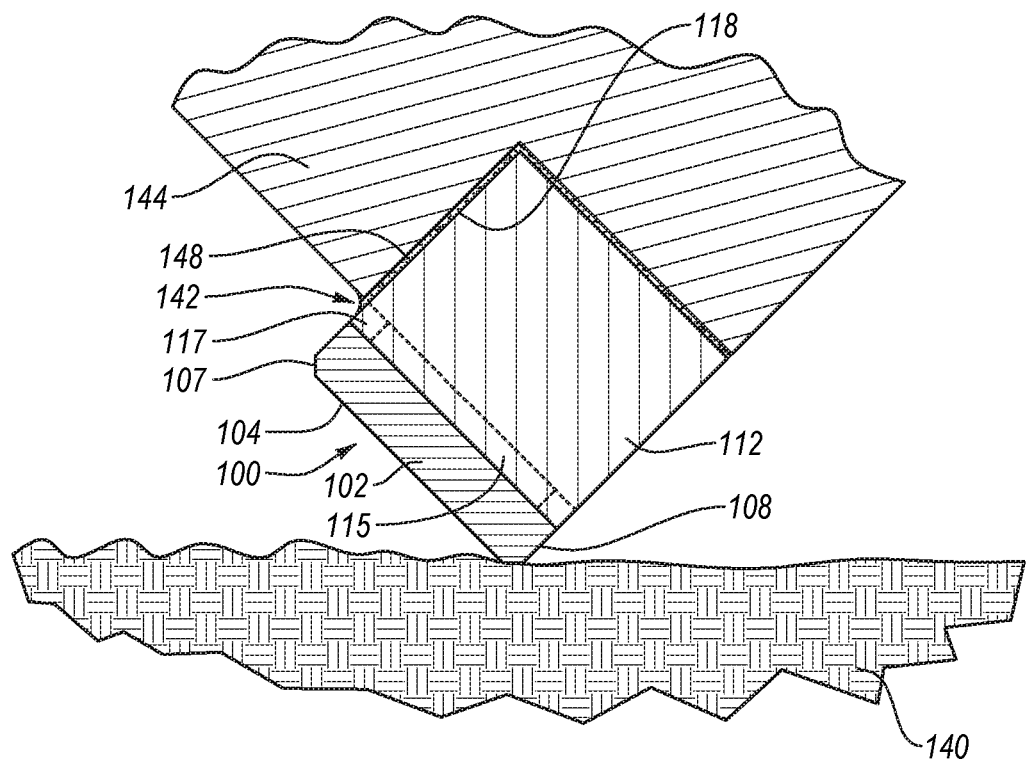
FIGS. 2A and 2B are cross-sectional views of an application in which a brazing process is utilized in connection with the superabrasive compact of FIGS. 1A and 1B, according to an embodiment.
Figure 2B:
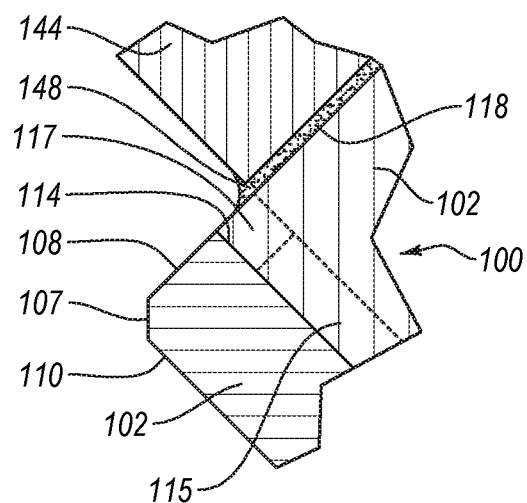

LME may be a concern for most brazing processes inasmuch as the process may include applying a liquid brazing alloy to the substrate 112 to secure the superabrasive compact 100 to drill bit body. FIGS. 2A and 2B are cross-sectional views of an application in which a brazing process may be utilized in connection with the superabrasive compact 100 of FIGS. 1A and 1B. In FIG. 2A, the superabrasive compact 100 is being used to cut into an earth formation 140, such as a subterranean formation. To facilitate use of the superabrasive compact 100 in this manner, the superabrasive compact 100 is secured within a recess 142 of a drill bit body 144. The drill bit body 144 may move along the earth formation 140 and cut into the earth formation 140 using one or more of the upper surface 104, the lateral surface 108, or the chamfer 107 of the superabrasive body 102.

The superabrasive compact 100 may be secured within the recess 142 in any suitable manner. For example, welding, mechanical fasteners, adhesives, or other processes or mechanisms may be used. Another process that may be used is brazing, which is described in more detail particularly with regard to FIG. 2B. Via brazing, the substrate 112 may be secured to one or more surfaces of the drill bit body 144, which may also be formed of a metal, alloy, an infiltrated carbide material, or combinations thereof. A braze 148 (e.g., a braze material or alloy) may be heated to slightly above a melting temperature thereof, and allowed to flow between the substrate 112 and the drill bit body 144. In an embodiment in which the substrate 112 includes cobalt-cemented tungsten-carbide, any of various braze alloys may be used. Suitable braze alloys may be selected from gold alloys, silver alloys, iron-nickel alloys, copper alloys, silicon alloys, other suitable braze alloys containing additional metallic constituents (e.g., transition metals), or combinations of any of the foregoing. In an embodiment, the braze alloy may include Ticusil® available from MTC Wesgo Metals of Hayward, Calif. In an embodiment, the braze alloy may include about 50 weight % ("wt %") silver, 20 wt % copper, 28 wt % zinc, and 2 wt % nickel, otherwise known as Silvaloy® A50N, which is currently commercially available from Wolverine Joining Technologies, LLC of Warwick, R.I. Other suitable braze alloys include AWS BAg-1 (44-46 wt % Ag, 14-16 wt % Cu, 14-18 wt % Zn, and 23-25 wt % Cd), AWS BAg-7 (55-57 wt % Ag, 21-23 wt % Cu, 15-19 wt % Zn, and 4.5-5.5 wt % Sn), and AWS BAg-24 (59-51 wt % Ag, 19-21 wt % Cu, 26-30 wt % Zn, and 1.5-2.5 wt % Ni), similar braze alloys, or equivalents thereof.

In some cases, the braze 148 may fill a clearance between the substrate 112 and drill bit body 144 that is between about 0.03 mm to about 0.08 mm, although the clearance may be larger or smaller. For instance, the clearance may be between about 0.01 mm to about 1 mm. If the contact angle between droplets of the braze 148 and substrate 112 is sufficiently low, the liquid metal "wets" the substrate 112. Good wetting characteristics are typically desired for creation of high-quality brazed joints. However, as discussed herein, wetting may also lead to LME under certain conditions.

More particularly, the residual tensile stresses proximate to the interfacial surface 114 may result in LME, thereby potentially causing cracks to form in the substrate 112. The cracks may form at or near the interfacial surface 114 and may propagate as additional stress is applied to the superabrasive compact 100.

Embodiments disclosed herein relate to mechanisms for eliminating and/or reducing LME. Such mechanisms include forming a protective material over or within at least the portions/regions of the substrate 112 adjacent to the interfacial surface 114 (e.g., the portions of the substrate most likely to experience residual tensile stresses). According to various embodiments, such mechanisms may be used to reduce or substantially eliminate wetting of selected regions of a superabrasive compact, such as one or more portions of the substrate 112.

Figure 3A:
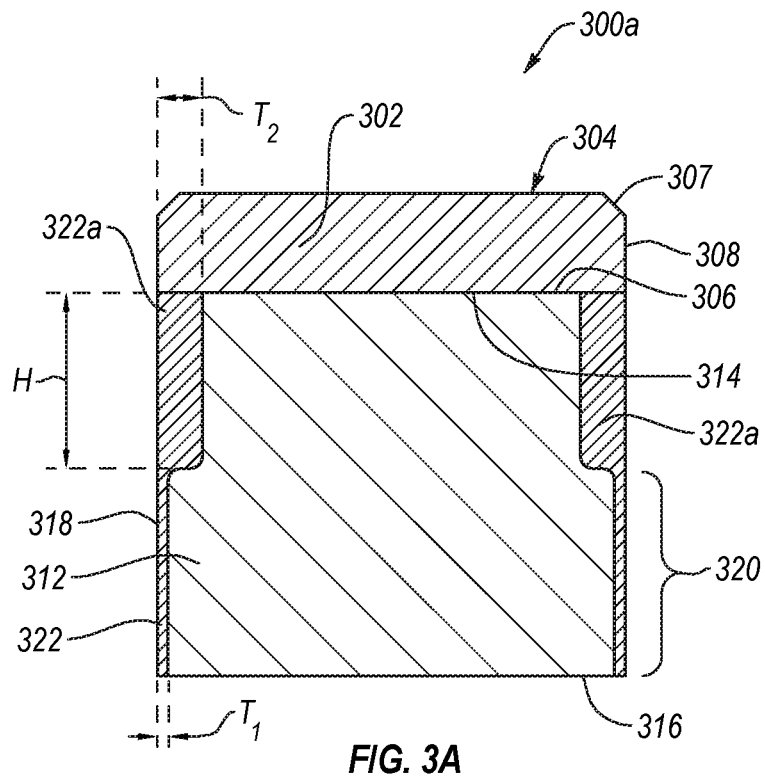
FIGS. 3A and 3B are cross-sectional views LME-resistant superabrasive compacts according to embodiments.
Figure 3B:
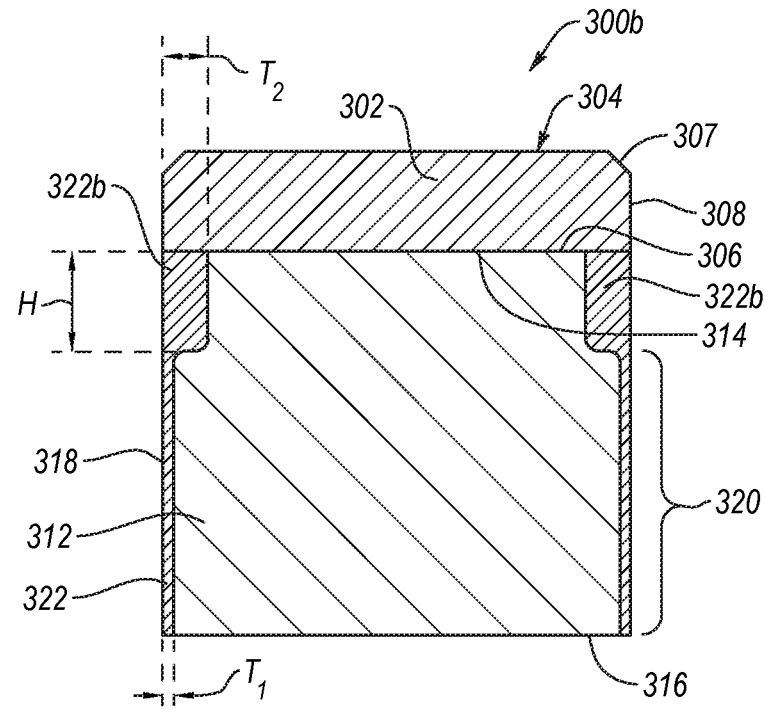

FIGS. 3A and 3B are cross sectional views of superabrasive compacts having braze-resistant regions thereon, according to embodiments. FIG. 3A illustrate a superabrasive compact 300a, according to an embodiment. The superabrasive compact 300a may include a superabrasive body 302 bonded to a substrate 312. The superabrasive body 302 and substrate 312 may be similar or identical to the superabrasive body 102 and substrate 112 with similar or identical features having similar or identical numbering, such as one or more features of substrate 312 being similar or identical to substrate 112. For example, the superabrasive body 302 may include an upper surface 304, a bonding surface 306, a lateral surface 308 extending between the upper surface 304 and the bonding surface 306, and optionally, a chamfer 307 extending between the upper surface 304 and the lateral surface 308. The substrate 312 may include an interfacial surface 314, a base surface 316 spaced from the interfacial surface 314, and at least one peripheral surface 318 extending between the interfacial surface 314 and the base surface 316. The substrate 312 of the superabrasive compact 300a may include a first region 320 having a native oxide and a second region 322a having a non-native oxide (e.g., induced oxide material).

The first region 320 may exhibit a region of oxidation having a thickness $T_1$. The thickness $T_1$ may be defined by limits of natural oxidation of the materials in the substrate 112. For example, when left in an ambient environment (e.g., open air), tungsten in a tungsten carbide substrate or a cementing constituent such as cobalt, iron, or nickel therein may at least partially oxidize at or near the peripheral surface 318. Upon naturally oxidizing (e.g., oxidation without added stimuli such as elevated heat or additional oxidizers) in open air to a depth in the substrate 312, the oxidation may substantially stop due to the porosity of the substrate and/or a coherent oxide layer on the oxidized metal substantially sealing the surface and limiting further oxidation. The oxidized metal may include any oxidized form of tungsten (e.g., tungsten(VI) oxide), cobalt (e.g., a cobalt oxide, such as an inert cobalt(III) oxide), iron, nickel, tantalum, titanium, vanadium, niobium, any other metal suitable for use in a cemented carbide substrate, or combinations thereof. The depth to which the natural oxidation takes place in the substrate 312, as measured from the peripheral surface 318, defines the thickness $T_1$. The thickness $T_1$ may extend about 50 nm or more into the substrate 312, such as about 50 nm to about 20 µm, about 500 nm to about 10 µm, about 1 µm to about 5 µm, or less than about 5 µm.

The second region 322a may include a non-native oxide having a thickness $T_2$. The non-native oxide may include at least one constituent (e.g., oxide(s)) not present in the substrate prior to HPHT sintering. The non-native oxide may be induced or formed via exposing one or more portions of the peripheral surface 318 to an oxidizing environment. Exposing one or more portions of the peripheral surface 318 to an oxidizing environment may include heating at least a portion of the superabrasive compact 300a such as one or more portions of the peripheral surface 318 of substrate 312 and/or exposing the one or more portions of the peripheral surface 318 to an oxidizing agent (e.g., a chemical oxidizer). The second region 322a having the non-native oxide may exhibit a greater thickness $T_2$ than the thickness $T_1$ of the first region 320 due to exposure of portion of the peripheral surface 318 adjacent to the second region 322a to enhanced oxidation conditions (e.g., elevated temperature and/or additional oxidizers). The thickness $T_2$ may be measured inward from the peripheral surface 318. The thickness $T_2$ may be about 100 nm or more, such as about 100 nm to about 40 µm, about 500 nm to about 30 µm, about 1 µm to about 20 µm, about 5 µm to about 15 µm, about 500 nm to about 10 µm, or less than about 20 µm. The thickness $T_2$ of the second region 322a may be at least about 110 percent of the thickness $T_1$ of the first region 320, such as about 110 percent to about 500 percent, about 150 percent to about 300 percent, or about 200 percent of the thickness $T_1$ of the first region 320. The second region 322a may extend from the interfacial surface 314 toward the base surface 316 a height H. The height H may be measured as the distance the non-native oxidation extends from the interfacial surface 314 toward the base surface 316. The height H may be about 1 μm or more, such as about 1 μm to about 10 mm, about 10 μm to about 5 mm, about 20 μm to about 1 mm, about 500 μm to about 2 mm, about 1 mm to about 1.5 mm, about 750 μm to about 1.8 mm, about 3 mm to about 10 mm, about 2 mm or more, about 1.27 mm (e.g., about 0.05 inches) or less, or less than about 2 mm. In an embodiment, the second region 322a may extend over half of a length of the peripheral surface 318 of the substrate 312 or more, such as over the upper half of the peripheral surface 318 to the interfacial surface 314. In an embodiment, the second region 322a may extend over half of the peripheral surface 318 of the substrate 312 or less, such as from the interfacial surface 314 over the upper third of the peripheral surface 318 or less.

FIG. 3B illustrates a superabrasive compact 300b, according to an embodiment. The superabrasive compact 300b be similar or identical to the superabrasive compact 300a, with similar or identical features having similar or identical numbering, such as substrate 312 being similar or identical to substrate 112 for example. The superabrasive compact 300b may include the substrate 312 having the first region 320 and a second region 322b. The second region 322b may exhibit a height H substantially smaller than the height H of the second region 322a. The height H of the second region 322a or 322b may be selected to cover only those regions of the substrate 312 adjacent to the interfacial surface 314 susceptible to LME (e.g., those portions expected to have residual tensile stress). Such regions may extend from the interfacial surface 314 toward the base surface 316.

The height H may vary depending on the size and/or position of the region (e.g., the region 115 of FIGS. 1A-2B) of the substrate 312 expected to experience residual tensile stresses. The position and/or size of the region may vary based on one or more of the materials in the superabrasive compact or substrate, the expected residual tensile stress on the substrate, the intended use of the superabrasive compact (e.g., the configuration of a cutter slot in a drill bit assembly), the design of the superabrasive compact, the method by which the braze-resistant region is formed, or any other suitable criteria. For example, the second region 322b may have a smaller height than the second region 322a due to selected specifications or more precise oxidation techniques. Either region 322a or 322 may be formed via lasing or heating a masked superabrasive compact in an oven.

Figure 4A:
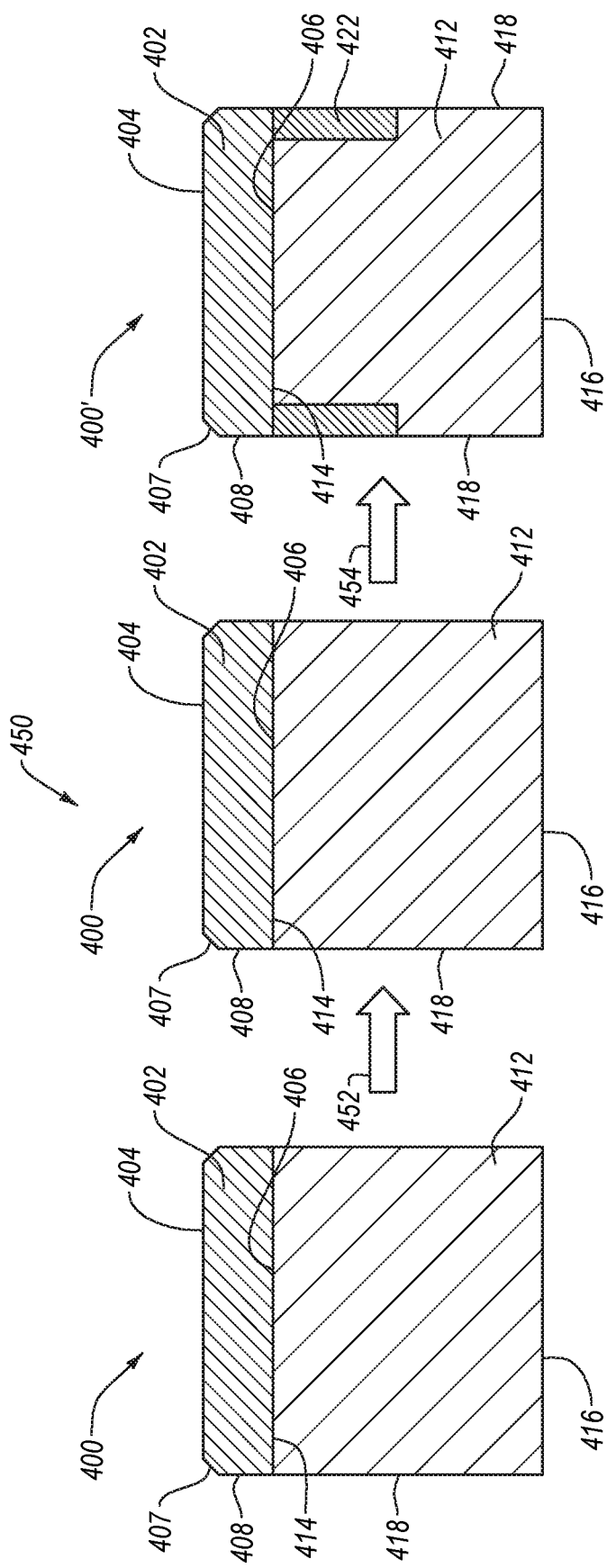
FIG. 4A is a schematic flow diagram of a method of making an LME-resistant superabrasive compact according to an embodiment.

FIG. 4A is a schematic flow diagram of an embodiment of a method 450 of making an LME-resistant superabrasive compact by forming a braze-resistant region extending into and/or on at least a portion of the superabrasive compact. The method 450 includes an 452 act of providing a superabrasive compact and an act 454 of forming a braze-resistant region extending into one or more surfaces of the superabrasive compact. The braze-resistant region may include at least one layer of oxidized material (e.g., metal oxide) on and/or within a region of the substrate of the superabrasive compact.

The act 452 of providing a superabrasive compact may include providing a superabrasive compact 400. The superabrasive compact 400 may be similar or identical to any superabrasive compact disclosed herein, such as the superabrasive compact 100, with similar or identical features having similar or identical numbering, such as one or more features of substrate 412 being similar or identical to substrate 312. In an embodiment, the superabrasive compact 400 may include a superabrasive body 402 bonded to a substrate 412. In an embodiment, the superabrasive body 402 may include a PCD table and the substrate 412 may include a cobalt-cemented tungsten carbide substrate. The superabrasive body 402 may include an upper surface 404, a bonding surface 406, and at least one lateral surface 408 extending between the upper surface and the bonding surface. The substrate 412 may include a base surface 416, an interfacial surface 414 bonded to the bonding surface 406, and a peripheral surface 418 extending between the base surface 416 and the interfacial surface 414.

As discussed above, the method 450 may include the act 454 of forming a braze-resistant region extending into one or more surfaces of the substrate. The braze-resistant region may exhibit a phobic response to a liquefied braze material such that the braze-resistant region remains substantially not wet and/or uncoated by liquid braze material. Accordingly, the phrase "phobic response" as used herein includes the meaning "tending to repel wetting." In an embodiment, the braze-resistant surface or region may include one or more of an oxide (e.g., non-native oxide) or a metallic sleeve (e.g., refractory metal coating). The refractory metal coating is separate and distinct from refractory metal in the substrate, such as a zirconium sleeve around a tungsten carbide substrate. In some embodiments, the refractory metal coating may include same or a different type of refractory metal as a refractory metal component in a cemented carbide substrate, such as tungsten in a cobalt-cemented tungsten carbide substrate.

In an embodiment, forming a braze-resistant region extending into one or more surfaces of the substrate may include forming an oxide on one or more surfaces of the substrate. Forming a braze-resistant region extending into and/or on one or more surfaces of the substrate may include exposing one or more portions of the peripheral surface 418 of the substrate 412 to oxidizing conditions. Exposing one or more portions so of the peripheral surface 418 of the substrate 412 to oxidizing conditions may include exposing one or more portions of the substrate 412 to an oxidizing agent or atmosphere. An oxidizing atmosphere can include an environment having one or more additional (e.g., non-ambient) oxidizing agents therein. For example, an oxidizing atmosphere may include an oxygen-enriched atmosphere (e.g., higher than ambient levels of $O_2$ gas), a halogen enriched atmosphere, an acidic fluid, exposure any other suitable oxidizing agent, or combinations of any of the foregoing. In an embodiment, oxidizing conditions may include elevated temperatures and/or pressures. For example, a temperature of at least a portion of the substrate 412 may be elevated above ambient temperature to a temperature suitable for oxidizing one or more materials in the substrate. In an embodiment, forming a braze-resistant region extending into one or more surfaces of the substrate 412 may include heating one or more portions of the peripheral surface 418 of the substrate 412 to temperature of at least about 300° C., such as about 300° C. to about 1200° C., 400° C. to about 1000° C., about 500° C. to about 800° C., 600° C. to about 900° C., or at least about 700° C.

In an embodiment, forming a braze-resistant region extending into one or more surfaces of the substrate includes lasing one or more surfaces of the substrate in an ambient atmosphere or an oxygen enriched atmosphere. Heating one or more surfaces of the substrate may include heating discrete portions of the substrate. Heating one or more surfaces of the substrate may include heating discrete portions of the surface of the substrate to at least partially melt the material therein and allowing the material to re-solidify. Such portions may be discernable as a recast region of one or more materials of the substrate such as cementing constituent (e.g., cobalt in a cobalt-cemented tungsten carbide substrate). The recast region may exhibit a different microstructure than the regions adjacent thereto, such as having different mechanical properties and/or different microstructure. For example, the recast region may form a substantially sealed region at least having a reduced porosity compared to adjacent non-recast regions. Heating discrete portions of the substrate may be accomplished via lasing one or more discrete portions of the substrate, such as a region of the peripheral surface 418 adjacent to the interfacial surface 414. The discrete portions of the substrate that are heated may include any of those heights H and thicknesses $T_2$ disclosed above. In an embodiment, forming a braze-resistant region extending into one or more surfaces of the substrate 412 may include heating one or more portions of the peripheral surface 418 while exposing the same to an oxidizing atmosphere. In an embodiment, lasing one or more discrete portions of the substrate may include varying the strength and/or focus of the laser. For example, in an embodiment, a laser may be defocused to selectively control the amount of energy applied to one or more surfaces of the substrate. In some embodiments, the spot size of the laser beam may be about 10 µm or larger, such as about 10 µm about 1 mm, about 25 µm to about 500 µm, about 50 µm to about 100 µm, about 40 µm to about 60 µm, about 1 mm or less, about 1 mm or more, or about 50 µm. In an embodiment, the amount of material removed or heated by the laser may be increased or decreased to provide a desired amount or rate of material removal or melting. In an embodiment, lasing one or more discrete portions of the substrate may include defocusing the laser to substantially only melt or heat one or more materials in the substrate and/or to substantially limit or prevent vaporization of substrate material. In an embodiment, the intensity or power of the laser may be selected to provide a desired heating/melting rate. In an embodiment, lasing one or more portions of the substrate may include using a fiber laser (e.g., ytterbium fiber laser), a carbon dioxide or carbon monoxide laser, a YAG laser (e.g., a Yb:YAG laser), a semi-conductor laser, a continuous wave laser (e.g., a laser having a continuous wave mode), a pulsed laser, a scanning laser, or any other suitable laser. In an embodiment, the laser may include a wattage of about 5 W or more, such as about 10 W to about 5 kW, about 20 W to about 100 W, about 10 W to about 30 W, or about 20 W. In an embodiment, the laser may produce a beam having a wavelength of about 400 nm or higher, such as about 400 nm to about 11 µm, about 1 µm to about 11 µm, about 1.05 µm to about 1.08 µm, or about 1.064 µm wavelength. In an embodiment, lasing one or more portions/regions of the substrate may include pulsing the laser for at least about 10 ns, such as about 10 ns to about 300 ns, about 50 ns, to about 200 ns, about 75 ns to about 125 ns, about 90 ns to about 120 ns, or about 100 ns. In an embodiment, lasing one or more portions/regions of the substrate may include using a pulse repetition rate of about 10 kHz to about 100 kHz, about 20 to about 80 kHz, about 10 to about 30 kHz, or about 20 kHz. The laser may include a 1 inch/s scan speed or higher, such as a 20 inch/s scan speed. In an embodiment, lasing one or more portions of the substrate may include altering the focus or strength of the laser, controlling the amount of oxygen or another material present while lasing, using materials that may release oxygen when heated on the surface, or combinations of any of the foregoing.

In an embodiment, lasing one or more discrete portions of the substrate may include at least partially annealing one or more portions of the substrate by heating the one or more portions to a suitable annealing temperature configured to relieve residual stresses therein. The lasing disclosed herein may be localized so as to limit the effects of such lasing to discrete portions of the superabrasive compact or substrate without compromising the superabrasive body (e.g., PCD table).

In an embodiment, lasing one or more discrete portions of the substrate may include changing the surface finish of the one or more discrete portions of the substrate, such as by creating a specific texture which may be repellant to liquefied braze materials (e.g., a substantially polished or sealed surface texture). Such surface texture may be employed on a coating, sleeve, or any other material disclosed herein to create a non-wettable region.

As shown in FIG. 4A, the resulting LME-resistant superabrasive compact 400' may include one or more regions 422 exhibiting a non-native oxide therein. Native oxides include only those materials present in the substrate prior to processing (e.g., lasing, heating in oxidizing environment, etc.). The non-native oxide may be differentiated from a native oxide by the depth of the oxidation in one or more regions or the concentration of the oxidized metal in a region. For example, a non-native oxide region may exhibit a concentration oxides of about 20% or more (e.g., about 50% or more) of the oxides in a native oxide containing region. The non-native oxide may be present in any of the thicknesses $T_2$ or ratios between a native oxide and a non-native oxide (e.g., $T_2:T_1$) disclosed above. Generally, the non-native oxide will exhibit a greater thickness $T_2$ or concentration to of oxidized material than a native oxide, which may cause the non-native oxide region to exhibit a substantially phobic response to a liquefied braze material. As noted above with respect to FIGS. 3A and 3B, the resulting LME-resistant superabrasive compact 400' may include a first region (not shown) having a native oxide and a second region 422 having a non-native oxide. The size of the second region 422 may be similar or identical the second region 322a or 322b described above with respect to FIGS. 3A and 3B.

In an embodiment, forming a braze-resistant region extending into one or more portions of a superabrasive compact may include heating the superabrasive compact in a furnace, induction coil, or oven. In an embodiment, substantially the entire substrate may be heated to a temperature where oxidization occurs, either in an open, a closed, or a controlled environment. In an embodiment, one or more portions of the substrate may be masked with a protective material (e.g., oxidation protective material) to prevent oxidation or other chemical reaction of the one or more portions. In an embodiment, forming a braze-resistant region extending into one or more portions of a superabrasive compact may include forming a protective material on at least a portion of one or more surfaces of the substrate, such as one or more portions remote from the interfacial surface (e.g., the base surface and the lower portion of the peripheral surface).

Figure 4B:
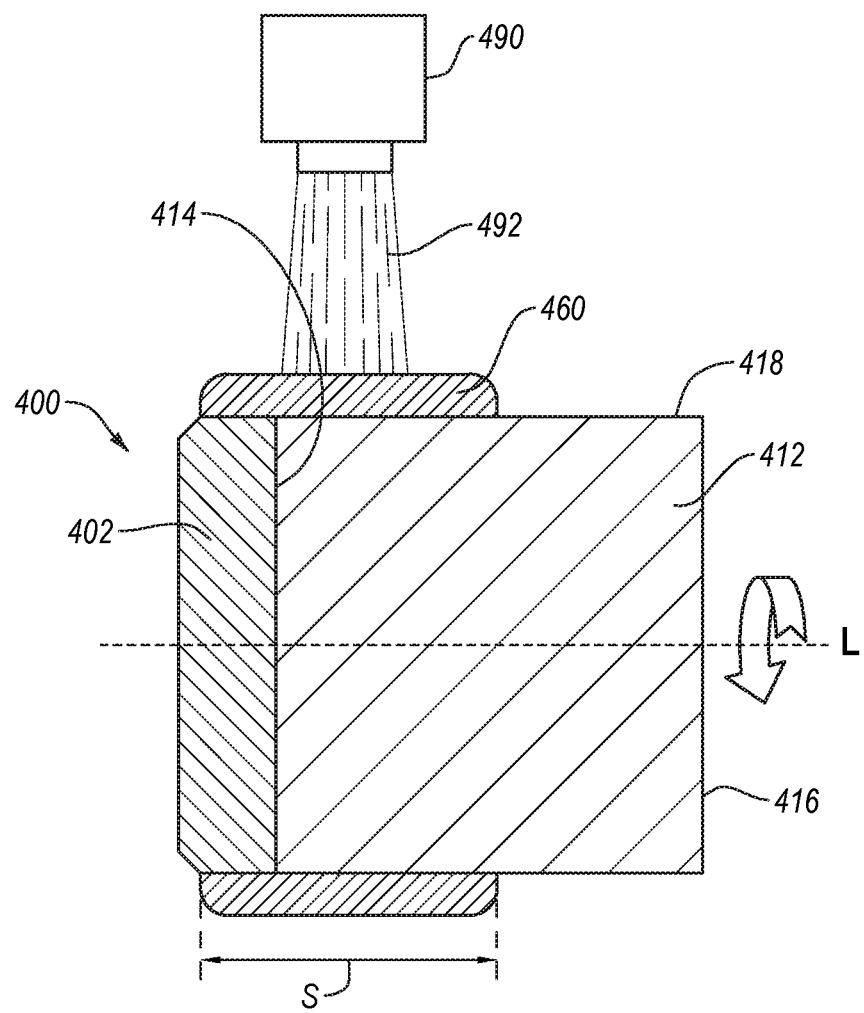
FIGS. 4B and 4C are cross-sectional views of a superabrasive compact and an LME-resistant superabrasive compact, prior to and after forming a braze-resistant region thereon, respectively, according to an embodiment
Figure 4C:
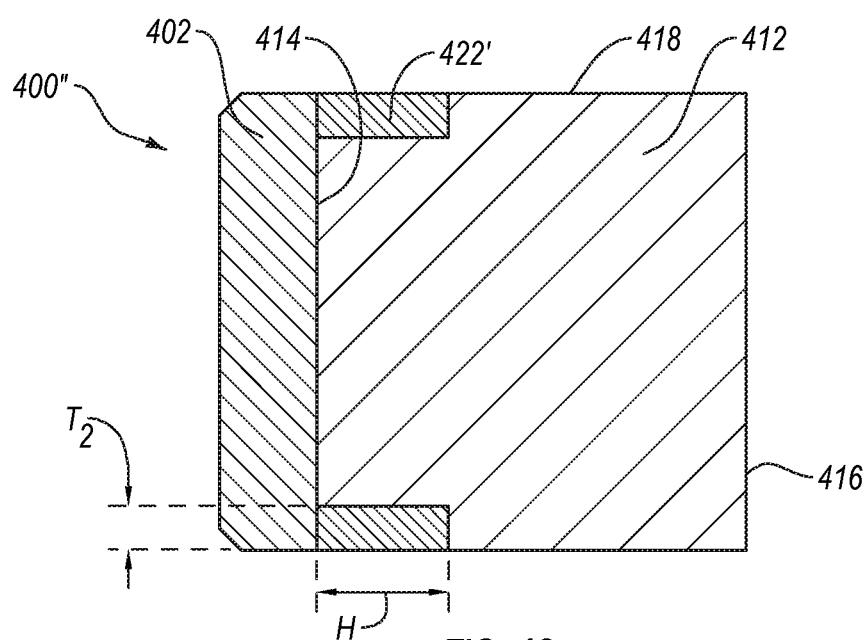

FIGS. 4B and 4C are cross-sectional views of the superabrasive compact 400 and the LME-resistant superabrasive compact 400" having a protective material 460, prior to and after chemical reaction (e.g., oxidation), respectively, according to an embodiment. In an embodiment, forming a braze-resistant region extending into one or more surfaces of the substrate 412 may include rotating a superabrasive compact (e.g., PDC) while lasing a region thereof or lasing one or more surfaces of the superabrasive compact with a scanning laser beam 492 from laser 490. For example, rotating the superabrasive compact 400 while lasing a portion thereof (e.g., peripheral surface 418 of the substrate 412) may include rotating the superabrasive compact 400 about a longitudinal axis L thereof in a rotary fixture while lasing at a fixed point, such that portions of the superabrasive compact (e.g., different portions of the peripheral surface) are moved to the fixed point via rotation of the superabrasive compact 400. In an embodiment, the superabrasive compact 400 may rotate slightly off center, such that the lased portion of the superabrasive compact exhibits an at least partially elliptical shape. In an embodiment, depending on the outer dimension of the superabrasive compact, the superabrasive compact 400 may be rotated at a speed of one rotation per minute or faster, such as one rotation every 10 seconds, one rotation every 22 seconds, one rotation every 24 seconds, or one rotation every 30 seconds. Each rotation of the superabrasive compact may include an over-rotation (e.g., overlap of rotation), such as an over-rotation of about 250 µm or more. In an embodiment, lasing may be carried out for only one rotation. In such embodiments, the height H of the braze resistant region may be approximately the spot width of the laser beam 492. In an embodiment (not shown), lasing may be carried out over multiple rotations of the superabrasive compact. On each successive rotation, the laser may be indexed to a longitudinally different position on of the peripheral surface or lateral surface which may allow larger portions of the substrate to be lased which may further result in a larger height H of the braze resistant region. The resulting LME-resistant superabrasive compact 400" may exhibit the second region 422'. The second region 422' may be similar or identical to the second region 422, 322a, or 322b. In an embodiment, the second region 422' may exhibit a height H of about the spot size of the laser beam 492, such as about 1 mm or smaller. The superabrasive compact 400" may include a first region (not shown) having a native oxide layer similar or identical to any first region disclosed herein.

In an embodiment, forming a braze-resistant region extending into one or more surfaces of the substrate 412 may include coating one or more portions of the superabrasive compact with a non-wettable material 455, such as on one or more portions of the substrate and/or the superabrasive body with a braze stop-off. Suitable non-wettable materials may include titanium nitride, ceramic coatings, shrink fit material bands, Nicrobraz® or any other suitable braze stop-off material, or combinations of any non-wettable materials disclosed herein. Non-wettable materials such as braze stop-off coatings may be applied by physical or chemical vapor deposition, paints, sprays, tapes, a stop-off pen, or any other means or technique for applying a material to a surface. Suitable non-wettable (e.g., braze stop-off) materials and methods of applying the same are disclosed in U.S. Pat. No. 8,863,864, which is incorporated herein, by this reference, in its entirety. In an embodiment, coating one or more portions of the superabrasive compact with a non-wettable material 455 may include coating at least the peripheral surface of the substrate adjacent to the interfacial surface with a braze stop-off. The non-wettable material may extend a length S along the peripheral surface 418 of the substrate 412. The length S may extend along about one tenth or more of the peripheral surface of the substrate 412, such as along about one half or more, about 1 third or more, about one quarter or more, about one quarter or less, about one half or less of the peripheral surface of the substrate 412. In some embodiments, the length S may be about 1.25 mm or more, about 1.25 mm or less, about 2 mm or less, or about 2 mm or more. As shown in FIGS. 4B and 4C, in some embodiments, forming a braze-resistant region extending into one or more surfaces of the substrate 412 may include lasing through at least a portion of the non-wettable coating 455 (e.g., braze stop-off). In an embodiment, the braze-resistant second region 422 of the LME resistant superabrasive table 400" may extend from the interfacial surface 414 along the peripheral surface 418 about 1.25 mm or less (e.g., about 0.05 inches), or about 1.25 mm or more. After lasing the through at least a portion of the non-wettable material 455, one or more remaining portions of the non-wettable material 455 may be removed via one or more of dissolution with a suitable solvent (e.g., with acetone), machining, grinding, milling, or breaking. The resulting second region 422 may exhibit the thickness $T_2$ substantially as described above.

Figure 5A:
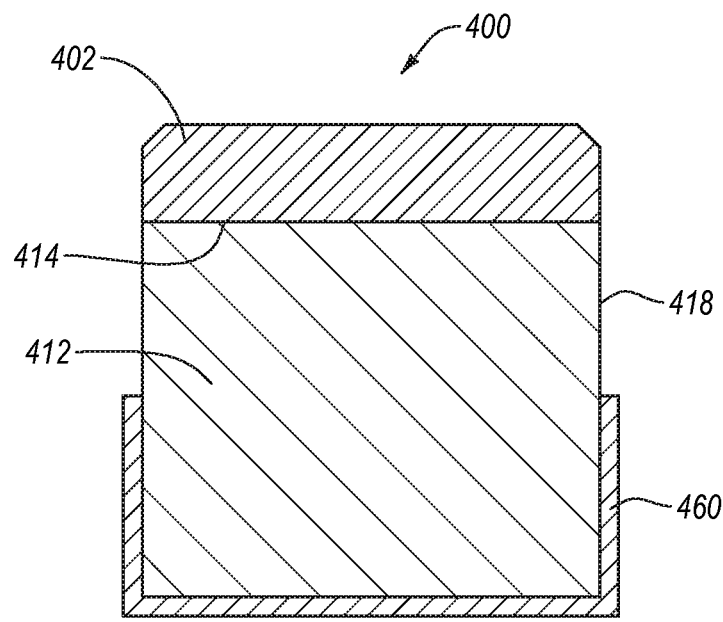
FIGS. 5A and 5B are cross-sectional views of a superabrasive compact and an LME-resistant superabrasive compact, prior to and after forming a braze-resistant region thereon, respectively, according to an embodiment.
Figure 5B:
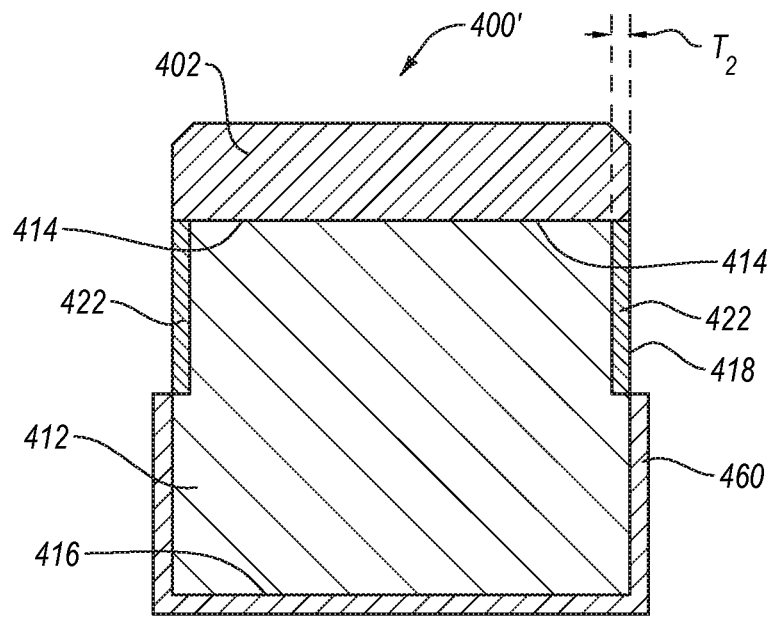

FIGS. 5A and 5B are cross-sectional views of the superabrasive compact 400 and the LME-resistant superabrasive compact 400' having a protective material 460, prior to and after chemical reaction (e.g., oxidation), respectively, according to an embodiment. The protective material 460 may be applied over, formed upon, or positioned adjacent to at least a portion of the superabrasive compact, such as over at least a portion of the substrate 412 and/or the superabrasive body 402. For example, the lower portion of peripheral surface 418 may be covered or coated with the protective material 460, such that during exposure to oxidizing conditions substantially only the portion of the peripheral surface 418 adjacent to the interfacial surface (e.g., the uncoated portion) may be oxidized. Suitable protective material may include one or more of a transition metal or an alloy thereof (e.g., nickel), a refractory metal or an alloy thereof (e.g., niobium, molybdenum, chromium, or Ti—Al alloy), a braze stop-off coating (e.g., Nicrobraz®), a masking compound, or another material selected to prevent chemical reaction with one or more metals at high temperatures (e.g., in an oxidizing environment). The protective material 460 may be brushed, sprayed, sputtered, vapor deposited, electrostatically deposited, positioned, electroplated, formed upon, electrolessly plated, press fit, or dipped onto or adjacent to one or more surfaces of the superabrasive compact 400 (e.g., the lower portion of the peripheral surface 418). In an embodiment, the protective material 460 may include a refractory metal can, such as a niobium can, configured to cover one or more portions of the substrate 412. The thickness of the protective material 460 may be about 1 µm or more, such about 1 µm to about 3 mm, about 100 µm to about 2 mm, or about 200 µm to about 1 mm. In some embodiments, the protective material 460 may extend from the base surface 416 toward the interfacial surface 414 to within about 1 mm or more from the interfacial surface 414, such as about 2 mm, 3 mm, 5 mm, or less than 1 mm from the interfacial surface 414. In some embodiments, the protective material 416 may cover about 95% or less of the peripheral surface 418, such as about 90% or less, 80% or less, about 75% or less, about 66% or less, about 50% or less, about 33% or less, about 25% or less, about 50% to about 75%, or about 10% or more of the peripheral surface 418, or ranges having endpoints of any of the above values in any combinations thereof. In some embodiments, the protective material 460 may be disposed (e.g., entirely cover) on the base surface 416.

In an embodiment, after providing at least a portion of the superabrasive compact 400 with the protective material 460, the entire superabrasive compact 400 may be placed into an oxidizing environment, such as an oven or an enclosure (e.g., a tank or vessel) having an oxidizing agent (e.g., ambient oxygen) therein. In an embodiment, forming a braze-resistant region extending into one or more surfaces/regions of the substrate may include heating the at least partially coated superabrasive compact in an ambient atmosphere. Heating the superabrasive compact may include heating the at least partially coated superabrasive compact 400 in an oven, furnace, or induction coil to a temperature effective to react (e.g., oxidize) at least one or more surfaces of the substrate, such as the peripheral surface proximate to the interfacial surface. In an embodiment, heating the superabrasive compact may include heating to a temperature of about 500° C. or more, such as about 700° C. or more.

As shown in FIG. 5B, after exposing the one or more surfaces of the substrate 412 to a reactive (e.g., oxidizing) environment, the resulting LME-resistant superabrasive compact 400' may include the one or more second regions 422 exhibiting a non-native oxide therein having a thickness $T_2$, and the portions below the protective material exhibit substantially no non-native oxides therein (e.g., may include only native oxides noted by the depth of thickness or concentration of the oxide layer). Subsequent to oxidation, the protective material 460 may be removed by one or more of brushing, media blasting, breaking, dissolution, or any other suitable means.

In some embodiments, forming a braze-resistant region extending into and/or on one or more surfaces/regions of a superabrasive compact (e.g., on one or more surfaces of the substrate) may include depositing a metallic material, layer, or coating on at least a portion of one or more surfaces of the substrate.

Figure 6A:
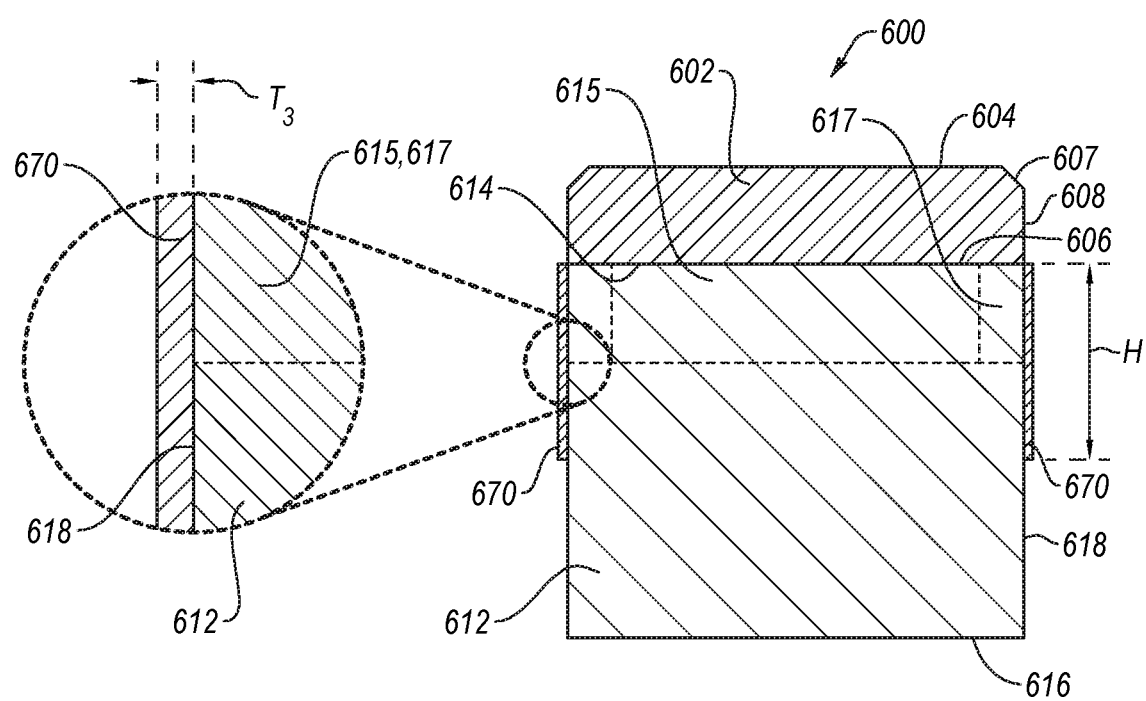
FIG. 6A is a cross-sectional view of an LME-resistant superabrasive compact having a metallic sleeve thereon, according to an embodiment.

FIG. 6A is a cross-sectional view of a superabrasive compact 600 having a metallic sleeve 670 (e.g., refractory metal layer) thereon, according to an embodiment. The superabrasive compact 600 may include a superabrasive body 602 bonded to a substrate 612, and the metallic sleeve 670 covering at least a portion of one or more surfaces of the superabrasive body 602. In an embodiment, the metallic sleeve 670 may cover at least a portion of one or more surfaces of the substrate 612. For example, the metallic sleeve 670 may be press-fitted with or slip-fitted on the substrate 612.

The superabrasive compact 600, superabrasive body 602, or substrate 612 may be similar or identical to the superabrasive compact 100, superabrasive body 102, or substrate 112 described above, respectively, including any materials, components, or properties thereof. The superabrasive body 602 may include a plurality of bonded superabrasive grains. The superabrasive body 602 may include an upper surface 604, a bonding surface 606, a lateral surface 608 extending between the upper surface 604 and the bonding surface 606, and optionally, a chamfer 607 extending between the lateral surface 608 and the upper surface 604. The substrate 612 may include an interfacial surface 614, a base surface 616, and a peripheral surface 618 extending between the interfacial surface 614 and the base surface 616. In an embodiment, the superabrasive body 602 may include a PCD table. An embodiment the substrate 612 may include cemented tungsten carbide, such as a cobalt-cemented tungsten carbide substrate. As described above with respect to FIGS. 1A-2B, upon HPHT processing, the substrate 612 may exhibit residual tensile stresses in a region 615 at or near the interfacial surface 614 caused at least in part by residual compressive stresses in the superabrasive body 602. A cracking zone 617 adjacent to the peripheral surface 618 in the region 615 may be particularly susceptible to liquid metal embrittlement which may result in propagation of cracking, spalling, or breaking therefrom. In embodiment, the metallic sleeve 670 may be disposed over at least a portion of the peripheral surface 618 of the substrate 612. The metallic sleeve 670 may be disposed over at least the cracking zone 617 to prevent wetting of the substrate 612 therein by a liquefied braze material. The metallic sleeve 670 may include one or more materials configured to prevent wetting by, or exhibit a phobic response to a liquefied braze material. Such a coating may limit or prevent liquid metal embrittlement.

The metallic sleeve 670 may include one or more refractory metals such as niobium, molybdenum, zirconium, tantalum, vanadium, chromium, or alloys including one or more of the foregoing metals and/or or a nickel alloy (e.g., Inconel or other nickel alloy). In an embodiment, the metallic sleeve 670 may additionally include a ceramic or ceramic forming constituent therein. In an embodiment, the metallic sleeve 670 may include refractory metal different from or the same as a refractory metal component in the substrate (e.g., a niobium sleeve and a tungsten carbide substrate). The ceramic forming constituent may include one or more of red phosphorus, hexagonal boron nitride, cubic boron nitride, alumina, zirconium, or combinations of any of the foregoing. The ceramic forming constituent may provide enhanced erosion resistance to the metallic sleeve 670.

As shown in FIG. 6A, the metallic sleeve 670 may exhibit a thickness $T_3$ extending from the peripheral surface 618 outward. The thickness $T_3$ of the metallic sleeve may be about 50 nm or more such as about 50 nm to about 1 mm, about 500 nm to about 500 µm, about 1 µm to about 300 µm, about 10 µm to about 200 µm, about 25 µm to about 125 µm, about 125 µm to about 250 µm, or less than about 1 mm. In an embodiment, the metallic sleeve 670 may exhibit a height H similar or identical to the height H described above with respect to superabrasive compact 300a or 300b. In an embodiment, the metallic sleeve 670 may be at least partially incorporated (e.g., infiltrated) into the peripheral surface 618 of the substrate 612.

Figure 6B:
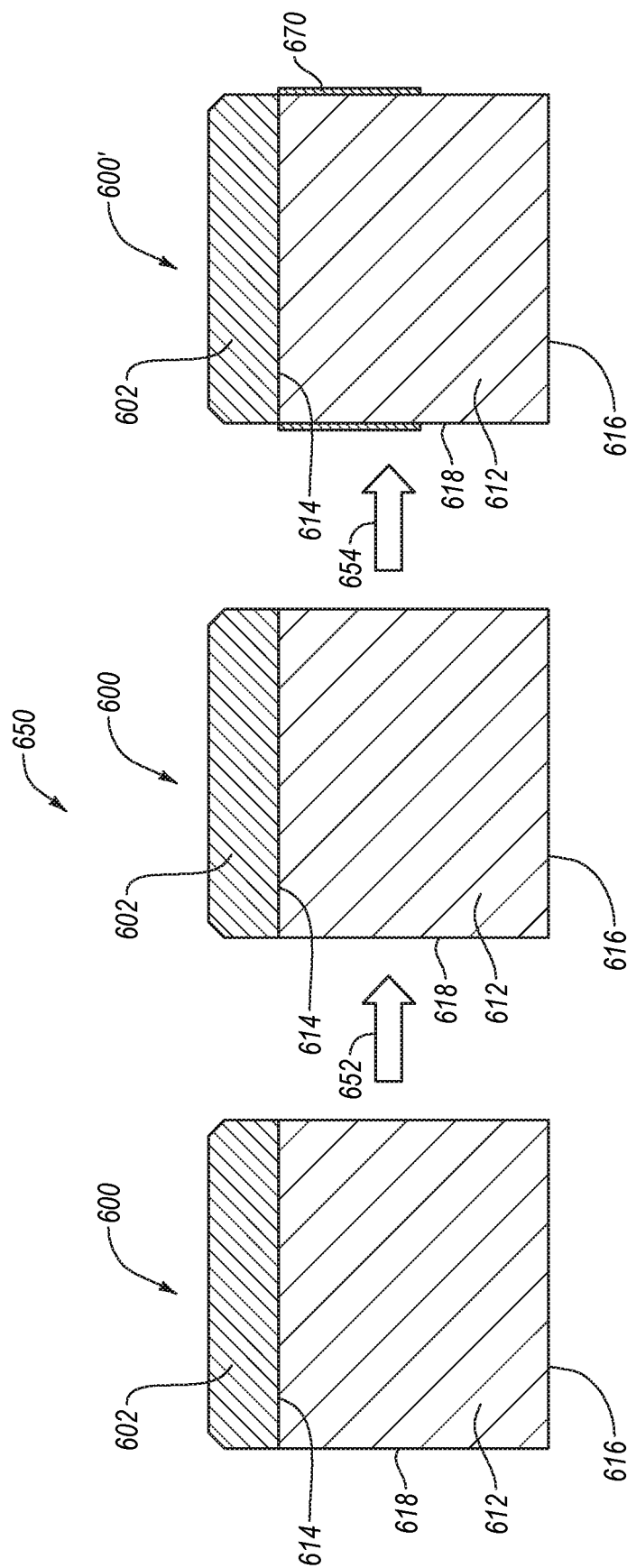
FIG. 6B is a schematic flow diagram of a method of making an LME-resistant superabrasive compact by forming a braze-resistant region on or extending into at least a portion of the superabrasive compact, according to an embodiment.

The metallic sleeve 670 may be secured to one or more portions of the superabrasive compact 600 by various techniques. FIG. 6B is a schematic flow diagram of an embodiment of a method of making an LME-resistant superabrasive compact by forming a braze-resistant region on at least a portion of the superabrasive compact. The braze-resistant region may include a metallic coating, sleeve, or layer (e.g., refractory metal layer or coating) substantially as described above.

The method 650 includes an 652 act of providing a superabrasive compact and an act 654 of forming a braze-resistant region extending into and/or on one or more surfaces of the superabrasive compact. The braze-resistant region may include a metallic sleeve or coating (e.g., refractory metal layer) on and/or within at least a portion of the substrate 612 of the superabrasive compact 600.

The act 652 of providing a superabrasive compact may include providing the superabrasive compact 600. The superabrasive compact 600 may be similar or identical to any superabrasive compact disclosed herein, including any components or properties thereof.

The method 650 may include the act 654 of forming a braze-resistant region extending into and/or on one or more surfaces of the substrate to form an LME-resistant superabrasive compact 600'. The braze-resistant region may exhibit a phobic response to a liquefied braze material such that the liquefied braze material remains substantially unbound (e.g., non-wetted) to the substrate portions having the braze-resistant region thereon. In an embodiment, the braze-resistant region may include the metallic sleeve 670. The metallic sleeve 670 may include may include any of those materials disclosed above for the metallic sleeve, such as refractory metals and/or carbide forming materials. In an embodiment, forming a braze-resistant region on one or more surfaces of the substrate may include forming, depositing, or bonding the metallic sleeve, such as a refractory metal coating, on at least a portion of the substrate (e.g., a portion of the peripheral surface).

In an embodiment, forming a braze-resistant region on one or more surfaces of the substrate 612 may include heating one or more portions of the peripheral surface 618 of the substrate 612 to temperature of at least about 300° C., such as about 300° C. to about 1200° C., 400° C. to about 1000° C., about 500° C. to about 800° C., 600° C. to about 900° C., or at least about 700° C. In an embodiment, forming a braze-resistant region on one or more surfaces of the substrate 612 may include heating prior to or simultaneously with bonding the refractory metal sleeve on at least a portion of the peripheral surface of the substrate. In an embodiment, forming a braze-resistant region on one or more portions of the substrate may include heating the superabrasive compact in an furnace, induction field or coil, or oven. In an embodiment, only a discrete portion or substantially the entire substrate may be heated.

In an embodiment, forming a braze-resistant region on one or more surfaces of the substrate may include depositing a metallic coating (e.g., a refractory metal coating) on a portion of the peripheral surface of the substrate. Depositing a refractory metal coating on a portion of the peripheral surface of the substrate may include bonding a refractory metal coating on a heated portion of the peripheral surface. In an embodiment, forming a refractory metal coating on a portion of the peripheral surface may include depositing a metallic coating on the peripheral surface via electroplating, mechanical plating (e.g., electroless plating), or vapor deposition, such as by one or more of chemical vapor deposition, physical vapor deposition, laser deposition, or sputter deposition. For example, at least a portion of the peripheral surface of a tungsten carbide substrate may be heated in an oven or furnace, and a metallic coating may deposited thereon via vapor deposition.

In an embodiment, forming a braze-resistant region on one or more surfaces of the substrate may include bonding at least a portion of one or more surfaces of the substrate to a metallic material temporarily bound thereto with a binder. For example, suitable temporary binders may include contact adhesives such as Gorilla Glue, Liquid Nails, or Loctite®; an epoxy; a wax, temporary metal attachments such as spot welds; or any other binder configured to hold the metallic material to a ceramic article. Subsequently, the bonded metallic material may be permanently affixed to at least a portion of one or more surfaces of the substrate to form the metallic sleeve 670. Permanently affixing the metallic sleeve 670 to at least a portion of one or more surfaces of the substrate may include heating the superabrasive compact, the metallic sleeve 670, and the binder to a temperature at which the binder thermally degrades and/or the metallic material of the metallic sleeve 670 becomes bound to the substrate such as by at least partial infiltration of the pores in the substrate therewith. In an embodiment, forming a braze-resistant region on one or more surfaces of the substrate by permanently affixing the metallic material to at least a portion of one or more surfaces of the substrate may include lasing the metallic sleeve onto one or more surfaces of the substrate, such as by laser welding. Permanently affixing the metallic material to at least a portion of one or more surfaces of the carbide substrate may include lasing the metallic material onto the at least a portion of the carbide substrate, and the lasing may be localized to at least one or more discrete portions of the peripheral surface of the substrate. In an embodiment, forming a braze-resistant region on one or more surfaces of the substrate may include temporarily coating one or more surfaces of the substrate with a refractory metal and welding (e.g., laser welding) it onto and/or into the one or more surfaces in an inert atmosphere, such as by lasing in an inert nitrogen or argon atmosphere. The resulting metallic sleeve may be liquid metal phobic substantially without any oxidation. In an embodiment, forming a braze-resistant region on one or more surfaces of the substrate may include affixing an acid resistant alloy (e.g., Inconel® or other nickel alloys, tantalum or alloys thereof, or niobium or alloys thereof) to one or more surfaces of the substrate. Such acid resistant alloys may protect the substrate when exposed to leaching conditions.

In an embodiment, forming a braze-resistant region on one or more surfaces of the substrate including forming, depositing, or bonding a metallic sleeve (e.g., a refractory metal coating) on at least a portion of the substrate further includes infiltrating at least a portion of the material of the metallic sleeve 670 into the substrate 612 to a depth from one or more surfaces (e.g., the peripheral surface 618) thereof. The depth may be about 50 nm or more, such as about 50 nm to about 100 µm, about 50 nm to about 100 nm, about 100 nm to about 200 nm, about 50 µm to about 100 µm, about 100 µm to about 200 µm, or about 250 nm to about 50 µm. The infiltrated material from the metallic region or body may prevent or eliminate surface and/or subsurface wetting of the substrate by the braze material, thereby at least partially limiting or eliminating LME therein.

In an embodiment, forming a braze-resistant region on one or more surfaces of the substrate including forming, depositing, or bonding a metallic sleeve (e.g., a refractory metal coating) on at least a portion of the substrate may include removing at least a portion of the substrate and replacing the portion with a refractory metal deposited therein. The portion may include the cracking zone 617 or portions adjacent thereto. The portion may include the region of the substrate having a reduced amount of binder material therein due to migration of the binder material into the superabrasive table during HPHT bonding. Removing at least a portion of the substrate may include removing a ring of material just below the interfacial surface 614, such as with a laser. The braze resistant region may be formed within a recess in the substrate. The recess may be about 50 nm deep or more, such as about 50 nm to about 5 mm, about 1 µm to about 3 mm, or about 100 µm to about 1 mm. One or more portions of the substrate may be removed via grinding, machining, lasing, or electro-discharge machining, or any other suitable technique. In an embodiment, the braze resistant region may be deposited into the substrate by any means disclosed herein, such as by chemical vapor deposition, physical vapor deposition, electroplating, mechanical plating, electroless plating, laser welding. In an embodiment, the braze resistant region may be modified to provide a desired texture to make those modified portions brazeable or unbrazeable. For example, a metallic sleeve may be ground, lased, or machined to remove at least some of the metallic sleeve from the substrate. Modifying the metallic sleeve may include removing the entire metallic sleeve from one or more portions of the substrate, or removing only a portion of the metallic sleeve from the substrate (e.g., thinning, texturing, or polishing). In an embodiment, such modified portions of the metallic sleeve may be shallow enough to leave the material in the recess near the interfacial surface 614 to that it may repel a liquefied braze material. In an embodiment, one or more polished portions or one or more texture portions may repel braze material better than non-modified portions.

The LME-resistant superabrasive compact 600' may include the metallic sleeve 670 on at least the portions of the peripheral surface 618 expected to experience residual tensile stresses, such as the portions adjacent to the interfacial surface 614. The metallic sleeve 670 may extend from the interfacial surface 614, or even slightly past the interfacial surface 614 (e.g., less than 1 mm onto the lateral surface of the superabrasive body 602) toward the base surface 616 to an intermediate point therebetween. As noted above, the metallic sleeve 670 may extend a height H, such as by way of example, about half of the peripheral surface or more or about half of the peripheral surface or less.

Figure 7A:
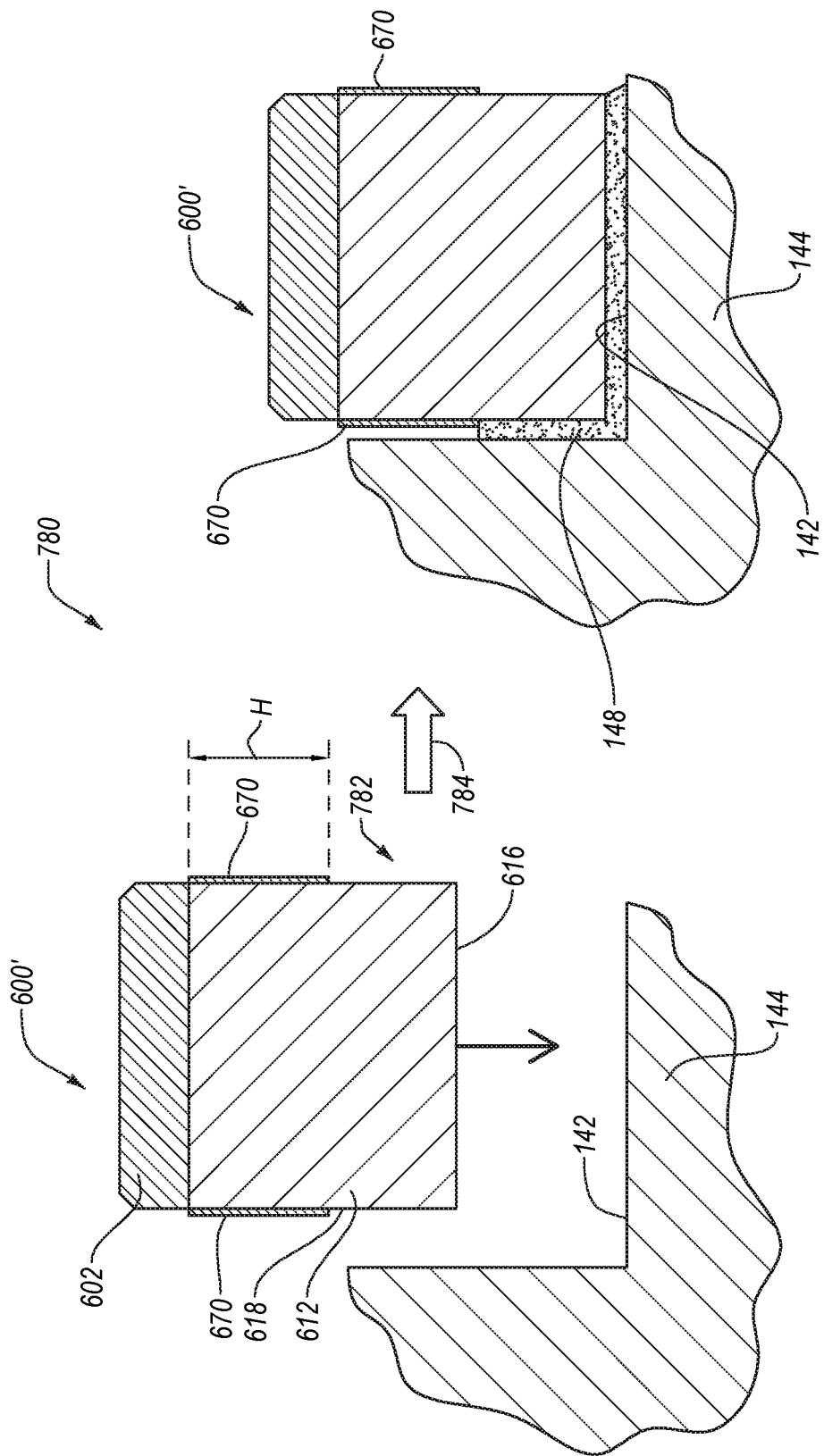
FIGS. 7A and 7B are schematic diagrams of methods of bonding a superabrasive compact to a drill bit body, according to embodiments.

In some embodiments, the superabrasive compacts herein may be affixed to a piece of equipment, such as a drill bit. FIG. 7A is a schematic diagram of a method 780 of affixing the LME-resistant superabrasive compact to a drill bit. The method 780 may include the act 782 of providing an LME-resistant superabrasive compact. The LME superabrasive compact may be identical or similar to any LME-resistant superabrasive compact herein (e.g., superabrasive compacts 300a, 300b, 400', 400", or 600'). For example, the LME-resistant superabrasive compact may be similar or identical to the LME-resistant superabrasive compact 600', including the superabrasive body 602, the substrate 612, and the metallic sleeve 670. In an embodiment the LME-resistant superabrasive compact may include a non-native oxide layer on a portion of the peripheral surface of the substrate. Although shown as the LME-resistant superabrasive compact 600', the LME-resistant superabrasive compact may be similar or identical to LME-resistant superabrasive compact 300a, 300b, 400', or 400" without limitation.

The method 780 may include the act 784 of affixing the LME-resistant superabrasive compact 300a, 300b, 400', 400", or 600' to a drill bit body. Affixing the LME-resistant superabrasive compact to a drill bit body 144 may include affixing the LME-resistant superabrasive compact in a recess 142 (e.g., cutter slot) of the drill bit body 144, disclosed above. Affixing the LME-resistant superabrasive compact to a drill bit body may include brazing the LME-resistant superabrasive compact to the drill bit, such as in the recess 142. Brazing may include positioning the LME-resistant superabrasive compact in the recess 142 of the drill bit body 144. Positioning the LME-resistant superabrasive compact in the drill bit body 144 may include placing the base surface 616 against or adjacent to the bottom or back of a recess 142. Positioning the LME-resistant superabrasive compact in the drill bit body may include placing the peripheral surface against or adjacent to a side wall of the recess 142. In an embodiment, the peripheral surface 618 and/or the base surface 616 may be spaced from the corresponding surfaces of the recess 142 by a clearance similar or identical to the clearance disclosed above with respect to FIGS. 2A and 2B. A braze material 148, substantially as disclosed above, may be heated to slightly above its melting temperature, and allowed to flow between the substrate 612 and the drill bit body 144 whereupon cooling the substrate 612 and the drill bit body 144 may be bound by the braze 148. Suitable braze alloys and techniques are disclosed above. During brazing, the braze 148 may at least partially wet those surfaces of the substrate 612 not protected by the braze-resistant region (e.g., metallic sleeve 670). The braze 148 may be repelled or remain substantially unbound to the braze-resistant region with substantially no wetting occurring. The portion of the peripheral surface having a braze-resistant region thereon may be selected to provide large enough wetted area with the braze material to ensure a strong bond the drill bit body 144, while providing enough peripheral surface free of braze material wetting to limit or eliminate LME caused therefrom. For example, the braze 148 may flow past or away from the braze-resistant region (e.g., metallic sleeve 670 or an oxide layer). The portion of the peripheral surface having a braze-resistant region thereon may be about one tenth or more of the peripheral surface, about half or more, or about a quarter or more. In an embodiment, the portion of the peripheral surface having a braze-resistant region thereon may be about three-fourths or less of the peripheral surface, about a third or less, about a quarter or less, or about one tenth or less of the peripheral surface.

Figure 7B:
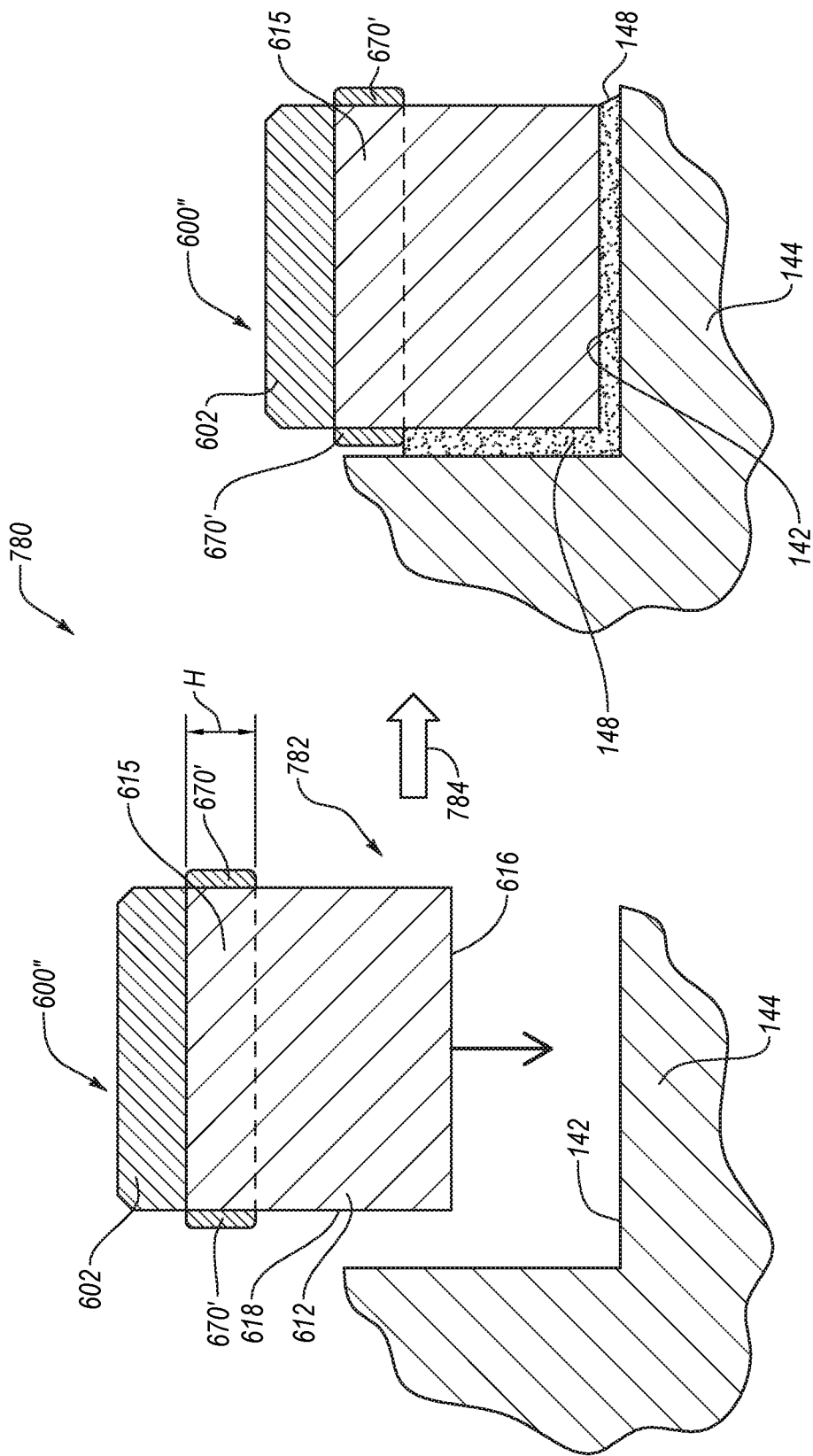

As shown in FIG. 7B, the method 780 may be used with LME-resistant superabrasive compacts having variously sized braze-resistant regions, such as the braze-resistant region formed by the metallic sleeve 670'. The method 780 may include the act 782 of providing an LME-resistant superabrasive compact as substantially as described above. The LME-resistant superabrasive compact may be identical or similar to any LME-resistant superabrasive compact herein (e.g., superabrasive compacts 300a, 300b, 400', 400" or 600'). For example, the LME-resistant superabrasive compact 600" may be similar or identical to the LME-resistant superabrasive compact 600', including the superabrasive body 602, the substrate 612, and the metallic sleeve 670'. In some embodiments, only a minimal portion of the peripheral surface 618 may include the metallic sleeve 670'. For example, substantially only those portions of the substrate expected to undergo LME due to proximity to a PCD table may include the metallic sleeve 670', such as the region 615 or cracking zone 617 (FIG. 6). The metallic sleeve 670' may be similar or identical to the metallic sleeve 670 and exhibit a smaller height H than the metallic sleeve 670 shown in FIG. 7A. In such an embodiment, the peripheral surface 618 may include more surface area available for wetting by the braze material 148 than the LME-resistant superabrasive compact 600' in FIG. 7A. A larger surface area for bonding may provide a stronger bond to the to the bit body 144 in the recess 142. The method 780 may include the act 784 of affixing the LME-resistant superabrasive compact to a drill bit body as described above. Although shown as LME-resistant superabrasive compact 600", the LME resistant superabrasive compact may be similar or identical to LME-resistant superabrasive compact 300a, 300b, or 400', 400", or 600' without limitation.

Figure 8A:
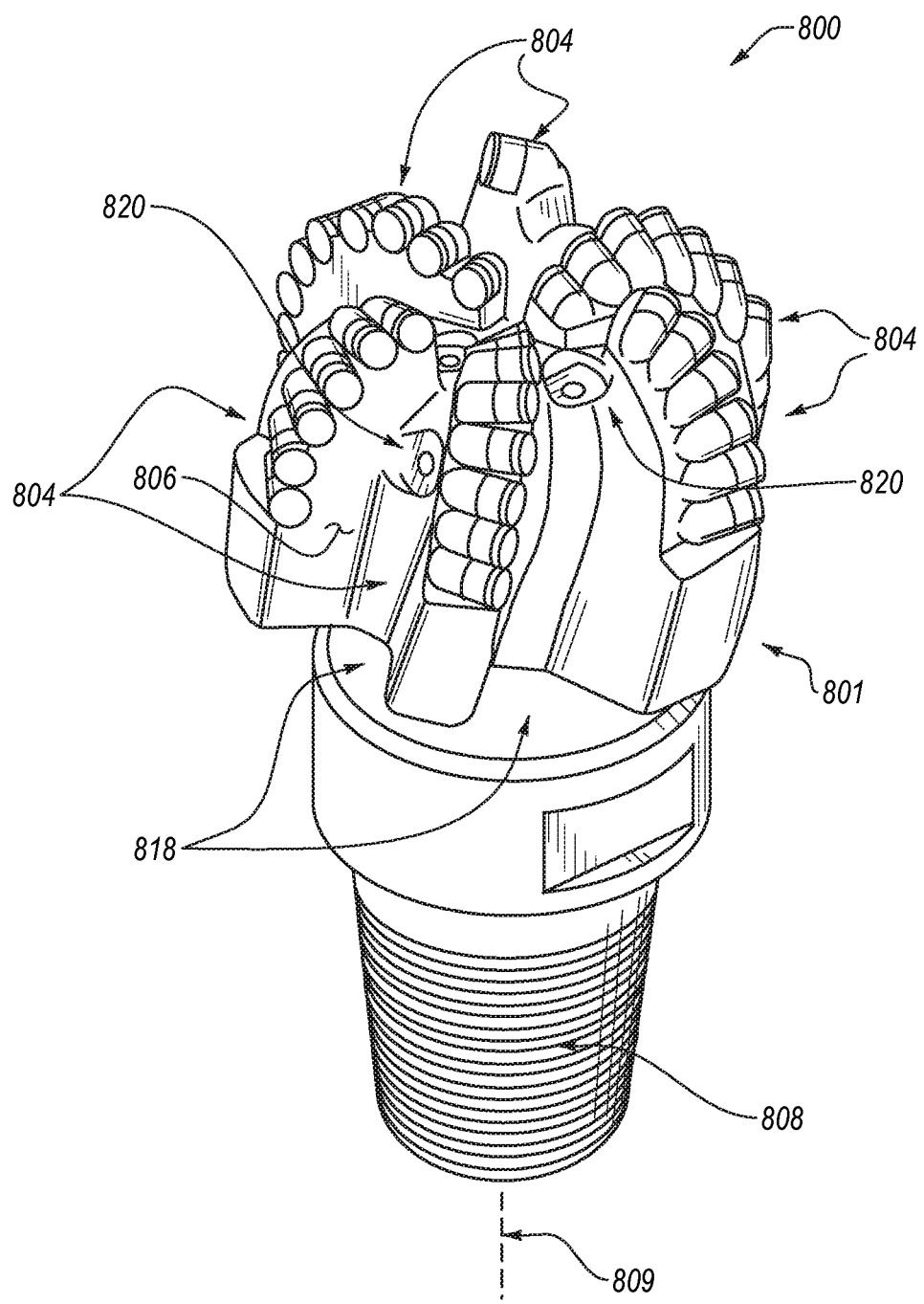
FIG. 8A is an isometric view of an embodiment of a rotary drill bit that may employ any of the LME-resistant superabrasive compacts disclosed herein as cutting elements.
Figure 8B:
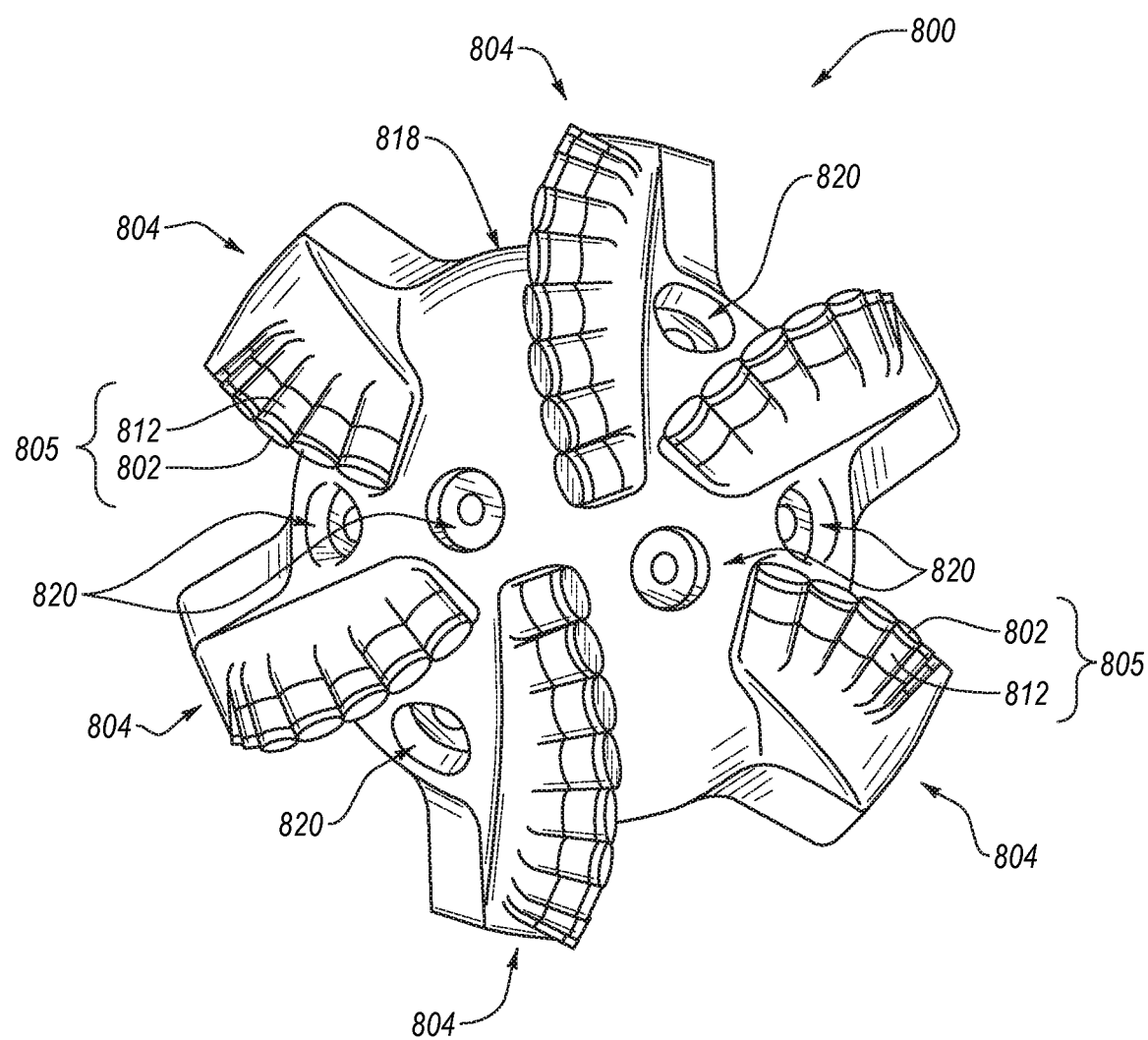
FIG. 8B is a top elevation view of the rotary drill bit shown in FIG. 8A.

Referring to FIGS. 8A and 8B, a superabrasive compact according to any of the foregoing embodiments may be used in a variety of applications, such as rotary drill bits. FIG. 8A is an isometric view and FIG. 8B is a top elevation view of an embodiment of a rotary drill bit 800. The rotary drill bit 800 includes at least one superabrasive compact, such as a PDC, which may be usable as a superabrasive cutting element 805 which may comprise any features of superabrasive compacts 300a, 300b, 400, or 600', or 600", in any combination, without limitation. The rotary drill bit 800 comprises a bit body 801 that includes radially-extending and longitudinally-extending blades 804 with leading faces 806, and a threaded pin connection 808 for connecting the bit body 801 to a drilling string. The bit body 801 defines a leading end structure for drilling into a subterranean formation by rotation about a longitudinal axis 809 and application of weight-on-bit.

At least one superabrasive cutting element 805 may be configured according to any of the previously described superabrasive compact embodiments may be affixed to the bit body 801. According to some embodiments herein, the at least one superabrasive cutting element 805 is disposed within a corresponding recess formed in the bit body 801. For example, recesses may be blind holes, pockets, or another suitable receptacle formed in the bit body 801, and the substrate portion of the superabrasive cutting elements 805 may be sized to generally correspond to the size the recesses. With reference to FIG. 8B, each of a plurality of cutting elements 805 is disposed within a corresponding one of the recesses of the blades 804.

More particularly, the rotary drill bit 800 shown in FIGS. 8A and 8B may be fabricated by positioning the superabrasive cutting elements 805 in a corresponding one of the recesses formed in the bit body 801, followed by subjecting the bit body 801, the superabrasive cutting elements 805, and braze alloy to a suitable braze processes that include temperature cycles that melt and cause the braze alloy to flow so that so that a strong metallurgical bond is formed between a substrate 812 of the superabrasive cutting element 805 and the bit body 801 upon cooling. The brazing temperature depends, at least in part, on the liquidus temperature of the braze alloy. For example, typically, the brazing temperature may be about 600° C. to 1050° C., such as about 600° C. to about 750° C.

Each cutting element 805 may include a superabrasive body 802 bonded to the substrate 812. More generally, the cutting elements 805 may comprise any superabrasive compact disclosed herein, without limitation. Accordingly, in some embodiments, the substrate 812, or a region of relatively high residual tensile stress within the substrate 812 and adjacent to an interface with the superabrasive body 802, is substantially prevented from becoming wetted by the flowing braze alloys during the braze processes by a braze-resistant region (not shown) as disclosed herein. In addition, if desired, in some embodiments, a number of the cutting elements 805 may be conventional in construction. Also, circumferentially adjacent blades 804 may define so-called junk slots 818 therebetween, as known in the art. Further, the rotary drill bit 800 may include a plurality of nozzle cavities 820 for communicating drilling fluid from the interior of the rotary drill bit 800 to the cutting elements 805.

FIGS. 8A and 8B merely depict one embodiment of a rotary drill bit 800 that employs at least one cutting element that comprises a superabrasive compact suitable for analysis and fabrication in accordance with the disclosed embodiments, without limitation. The rotary drill bit 800 is used to represent any number of earth-boring tools or drilling tools, including, for example, core bits, roller cone bits, fixed cutter bits, eccentric bits, bicenter bits, reamers, reamer wings, or any other downhole tool including superabrasive compacts or PDCs, without limitation.

The superabrasive compacts disclosed herein may also be utilized in applications other than cutting technology. For example, the disclosed superabrasive compact embodiments may be used in wire dies, bearings, artificial joints, inserts, cutting elements, and heat sinks. Thus, any of the superabrasive compacts disclosed herein may be employed in an article of manufacture including at least one superabrasive element or compact.

Thus, the embodiments of superabrasive compacts disclosed herein may be used in any apparatus or structure in which at least one conventional PDC is typically used. In one embodiment, a rotor and a stator, assembled to form a thrust-bearing apparatus, may each include one or more superabrasive compacts configured according to any of the embodiments disclosed herein and may be operably assembled to a downhole drilling assembly. U.S. Pat. Nos. 4,410,054; 4,560,014; 5,364,192; 5,368,398; and 5,480,233, the disclosure of each of which is incorporated herein, in its entirety, by this reference, disclose subterranean drilling systems within which bearing apparatuses utilizing superabrasive compacts disclosed herein may be incorporated. The embodiments of superabrasive compacts disclosed herein may also form all or part of heat sinks, wire dies, bearing elements, cutting elements, cutting inserts (e.g., on a roller-cone-type drill bit), machining inserts, or any other article of manufacture as known in the art. Other examples of articles of manufacture that may use any of the superabrasive compacts disclosed herein are disclosed in U.S. Pat. Nos. 4,811,801; 4,268,276; 4,468,138; 4,738,322; 4,913,247; 5,016,718; 5,092,687; 5,120,327; 5,135,061; 5,154,245; 5,180,022; 5,460,233; 5,544,713; and 6,793,681, the disclosure of each of which is incorporated herein, in its entirety, by this reference.

Working Example

The following working example sets forth a method for forming LME-resistant PDCs. The following working example provides further detail in connection with the specific embodiments described above. In the working example, PDCs each of which includes a PCD table bonded to a cobalt-cemented tungsten carbide substrate were formed in an HPHT process. A peripheral surface of the substrate adjacent to an interfacial surface between the substrate and the PCD table was coated with a layer of Nicrobraz® Green Stop-Off™, type 1 from Wall Colmonoy Corporation of Madison Heights, Mich. The coating extended about 250 µm onto the lateral surface of the PCD table and about 1 mm onto the peripheral surface of the substrate. The PDC was placed in a rotary fixture under an Ytterbium Fiber Laser from IPG Photonics Corporation of Oxford, Mass. The laser was fired at 20 watts with a 1064 nm wavelength, a 100 ns pulse duration, and a 20 kHz repetition rate, with a spot size of about 50 µm, and a scan speed of about 20 inch/s. The lased portion of the PDC included about 250 µm of the PCD table and about 1 mm of the substrate adjacent to the interfacial surface of the substrate circumferentially about the PDC. During lasing, PDCs having an outside diameter of about 0.615 inches were rotated once per 24 seconds and PDCs having an outside diameter of about 0.529 inches were rotated once in about 22 seconds. The PDCs were slightly over rotated on the rotary fixture during lasing to ensure that the entire circumference of the peripheral surface of the substrate was lased. The lased PDC was removed from the fixture and any remaining Nicrobraz® was cleaned from the peripheral and lateral surfaces with acetone and a towel.

While various aspects and embodiments have been disclosed herein, other aspects and embodiments are contemplated. The various aspects and embodiments disclosed herein are for purposes of illustration and are not intended to be limiting. Additionally, the words "including," "having," and variants thereof (e.g., "includes" and "has") as used herein, including the claims, shall be open ended and have the same meaning as the word "comprising" and variants thereof (e.g., "comprise" and "comprises").

What is claimed is:

1. A polycrystalline diamond compact, comprising:
a polycrystalline diamond body having a plurality of bonded diamond grains, an upper surface, a bonding surface, and at least one lateral surface extending between the upper surface and the bonding surface; and
a substrate bonded to the polycrystalline diamond body, the substrate including:
a plurality of cemented carbide grains;
a base surface;
an interfacial surface bonded to the bonding surface; and
a peripheral surface extending between the base surface and the interfacial surface, at least a portion of the peripheral surface including a braze-resistant region that extends into one or more surfaces of the carbide substrate, the braze-resistant region exhibiting a phobic response to a liquefied braze material, and the braze-resistant region including a non-native oxide on the at least a portion of the peripheral surface, the non-native oxide having a thickness greater than a thickness of a native oxide on another portion of the peripheral surface.

2. The polycrystalline diamond compact of claim 1, wherein the braze-resistant region includes one or more of niobium, molybdenum, zirconium, tantalum, red phosphorous, hexagonal boron nitride, cobalt oxide, cubic boron nitride, alumina, zirconia, or alloys including one or more of the foregoing.

3. The polycrystalline diamond compact of claim 1, wherein the at least a portion of the peripheral surface having the braze-resistant region includes a portion of the peripheral surface extending about 2 mm or less from the interfacial surface.

4. The polycrystalline diamond compact of claim 1, wherein the braze-resistant region includes a refractory metal coating on the at least a portion of the peripheral surface of the carbide substrate.

5. The polycrystalline diamond compact of claim 1, wherein the cemented carbide grains include tungsten carbide, titanium carbide, chromium carbide, niobium carbide, tantalum carbide, vanadium carbide, or combinations thereof.

6. The polycrystalline diamond compact of claim 1, wherein the cemented carbide grains include cobalt-cemented tungsten carbide grains.

7. The polycrystalline diamond compact of claim 1, wherein the polycrystalline diamond body includes a leached region extending inwardly from the upper surface.

8. A polycrystalline diamond compact, comprising:
a polycrystalline diamond body having a plurality of bonded diamond grains, an upper surface, a bonding surface, and at least one lateral surface extending between the upper surface and the bonding surface; and
a substrate bonded to the polycrystalline diamond body, the substrate including:
a plurality of cemented carbide grains;
a base surface;
an interfacial surface bonded to the bonding surface; and
a peripheral surface extending between the base surface and the interfacial surface, at least a portion of the peripheral surface including a lased braze-resistant region that extends into one or more surfaces of the carbide substrate, and the lased braze-resistant region exhibiting a phobic response to a liquefied braze material, wherein the lased braze-resistant region includes a non-native oxide on the at least a portion of the peripheral surface, the non-native oxide having a thickness greater than a thickness of a native oxide on another portion of the peripheral surface.

9. The polycrystalline diamond compact of claim 8, wherein the lased braze-resistant region exhibits less porosity than an adjacent non-lased region of the peripheral surface of the substrate.

10. The polycrystalline diamond compact of claim 8, wherein the lased braze-resistant region includes an annealed region of the substrate adjacent to a non-annealed region of the substrate.

11. The polycrystalline diamond compact of claim 8, wherein the lased braze-resistant region includes a surface texture that is different than the surface texture of a non-lased region of the peripheral surface of the substrate.

12. The polycrystalline diamond compact of claim 8, wherein the at least a portion of the peripheral surface having the lased braze-resistant region includes a metallic material lased onto the at least a portion of the peripheral surface.

13. The polycrystalline diamond compact of claim 8, wherein the braze-resistant region includes one or more of niobium, molybdenum, zirconium, tantalum, red phosphorous, hexagonal boron nitride, cobalt oxide, cubic boron nitride, alumina, zirconia, or alloys including one or more of the foregoing.

14. The polycrystalline diamond compact of claim 8, wherein the at least a portion of the peripheral surface having the lased braze-resistant region includes a portion of the peripheral surface extending about 2 mm or less from the interfacial surface.

15. The polycrystalline diamond compact of claim 8, wherein the cemented carbide grains include tungsten carbide, titanium carbide, chromium carbide, niobium carbide, tantalum carbide, vanadium carbide, or combinations thereof.

16. The polycrystalline diamond compact of claim 8, wherein the cemented carbide grains include cobalt-cemented tungsten carbide grains.

17. A polycrystalline diamond compact, comprising:
a polycrystalline diamond body having a plurality of bonded diamond grains, an upper surface, a bonding surface, and at least one lateral surface extending between the upper surface and the bonding surface; and
a substrate bonded to the polycrystalline diamond body, the substrate including:
a plurality of cobalt-cemented tungsten carbide grains,
a base surface;
an interfacial surface bonded to the bonding surface; and
a peripheral surface extending between the base surface and the interfacial surface, at least a portion of the peripheral surface including a braze-resistant region that extends into one or more surfaces of the carbide substrate about 2 mm or less from the interfacial surface, the braze-resistant region exhibiting a phobic response to a liquefied braze material, and the braze-resistant region including a non-native oxide on the at least a portion of the peripheral surface, the non-native oxide having a thickness greater than a thickness of a native oxide on another portion of the peripheral surface.

* * * * *